(12) United States Patent
Yuan et al.

(10) Patent No.: US 10,877,107 B2
(45) Date of Patent: Dec. 29, 2020

(54) MAGNETIC FIELD SENSING DEVICE AND MAGNETIC FIELD SENSING APPARATUS

(71) Applicants: Fu-Te Yuan, New Taipei (TW); Meng-Huang Lai, New Taipei (TW)

(72) Inventors: Fu-Te Yuan, New Taipei (TW); Meng-Huang Lai, New Taipei (TW)

(73) Assignee: iSentek Inc., New Taipei (TW)

( * ) Notice: Subject to any disclaimer, the term of this patent is extended or adjusted under 35 U.S.C. 154(b) by 229 days.

(21) Appl. No.: 16/036,948

(22) Filed: Jul. 17, 2018

(65) Prior Publication Data

US 2019/0018072 A1    Jan. 17, 2019

Related U.S. Application Data

(60) Provisional application No. 62/533,130, filed on Jul. 17, 2017.

(51) Int. Cl.
*G01R 33/00* (2006.01)
*G01R 33/09* (2006.01)

(52) U.S. Cl.
CPC .......... *G01R 33/0011* (2013.01); *G01R 33/09* (2013.01)

(58) Field of Classification Search
CPC .............................. G01R 33/0011; G01R 33/09
See application file for complete search history.

(56) References Cited

U.S. PATENT DOCUMENTS

| | | | |
|---|---|---|---|
| 2013/0207645 | A1 | 8/2013 | Kong |
| 2014/0015525 | A1 | 1/2014 | Paci et al. |
| 2014/0353785 | A1* | 12/2014 | Paci .................. H01L 27/22 257/427 |
| 2016/0202329 | A1* | 7/2016 | Paci .................. H01L 43/08 324/252 |
| 2017/0176545 | A1* | 6/2017 | Deak ............. G01R 33/0206 |

FOREIGN PATENT DOCUMENTS

| | | |
|---|---|---|
| CN | 1405754 | 3/2003 |
| CN | 104656045 | 5/2015 |
| TW | 201715251 | 5/2017 |

OTHER PUBLICATIONS

"Office Action of China Counterpart Application", dated Aug. 4, 2020, p.1-p.10.

* cited by examiner

*Primary Examiner* — Daniel R Miller
(74) *Attorney, Agent, or Firm* — JCIPRNET

(57) ABSTRACT

A magnetic field sensing device including a substrate, a plurality of magnetic flux concentrators and a plurality of magneto-resistive sensors and a plurality of magnetic setting structures is provided. The magnetic flux concentrators, the magneto-resistive sensors and the magnetic setting structures are disposed on the substrate. At least a portion of the magneto resistive sensors is disposed at two opposite sides of each of the magnetic flux concentrators. The orthogonal projection regions of each of the magnetic flux concentrators, at least a portion of the magneto-resistive sensors, and each of the magnetic setting structures on the substrate are respectively a first orthogonal projection region, a second orthogonal projection region, and a third orthogonal projection region. The third orthogonal projection region at least overlaps the first orthogonal projection region and at least a portion of the second orthogonal projection region. Furthermore, a magnetic field sensing apparatus is also provided.

15 Claims, 18 Drawing Sheets

MAGNETIC FIELD SENSING DEVICE AND MAGNETIC FIELD SENSING APPARATUS

CROSS-REFERENCE TO RELATED APPLICATION

This application claims the priority benefits of U.S. provisional application Ser. No. 62/533,130, filed on Jul. 17, 2017. The entirety of the above-mentioned patent application is hereby incorporated by reference herein and made a part of this specification.

BACKGROUND OF THE INVENTION

Field of the Invention

The invention is related to a magnetic field sensing device and a magnetic field sensing apparatus.

Description of Related Art

With the popularity of portable electronic apparatus, electronic compasses capable of sensing the direction of the earth's magnetic field have drawn more and more attention. When the electronic compasses are applied to small portable electronic apparatuses (e.g., smart phones), the electronic compasses are not only required to have small volume but also able to perform the 3-axis sensing function. Accordingly, three-direction magnetic field sensing apparatus is commonly applied to various electronic devices in recent years.

However, in the process of sensing magnetic field, due to hysteresis phenomenon, even if an external magnetic field is disappeared, the ferromagnetic material in the magnetic field sensing apparatus is still affected by the original external magnetic field and thus having residual magnetism, which causes error of sensing result. Accordingly, practitioners of the field have been trying to solve the above problem.

SUMMARY OF THE INVENTION

The invention provides a magnetic field sensing device and a magnetic field sensing apparatus, capable of performing magnetization resetting on a magneto-resistive sensor and magnetic flux concentrator while having a small size, thereby acquiring accurate sensing result.

According to an embodiment of the invention, a magnetic field sensing device includes a substrate, a plurality of magnetic flux concentrators, a plurality of magneto-resistive sensors and a plurality of magnetic setting structures. The magnetic flux concentrators, the magneto-resistive sensors and the magnetic setting structures are disposed on the substrate. At least a portion of the magneto-resistive sensors is disposed on two opposite sides of each of the magnetic flux concentrators. An orthogonal projection region of each of the magnetic flux concentrators on the substrate is a first orthogonal projection region. An orthogonal projection region of at least a portion of the magneto-resistive sensors on the substrate is a second orthogonal projection region. An orthogonal projection region of each of the magnetic setting structures on the substrate is a third orthogonal projection region. The third orthogonal projection region at least overlaps the first orthogonal projection region and at least a portion of the second orthogonal projection region respectively.

According to an embodiment of the invention, a magnetic field sensing apparatus includes a substrate and at least one magnetic field sensing device. The magnetic field sensing device includes a plurality of first magnetic flux concentrators, a plurality of first magneto-resistive sensors and a plurality of first magnetic setting structures. The first magnetic flux concentrators, the first magneto-resistive sensors and the first magnetic setting structures are disposed on the substrate. At least a portion of the magneto-resistive sensors is disposed on two opposite sides of each of the first magnetic flux concentrators. An orthogonal projection region of each of the first magnetic flux concentrators on the substrate is a first orthogonal projection region. An orthogonal projection region of at least a portion of the first magneto-resistive sensors on the substrate is a second orthogonal projection region. An orthogonal projection region of each of the first magnetic setting structures on the substrate is a third orthogonal projection region. The third orthogonal projection region at least overlaps the first orthogonal projection region and at least a portion of the second orthogonal projection region respectively.

Based on the above, in the magnetic field sensing device and the magnetic field sensing apparatus in the embodiment of the invention, by arranging the magnetic setting structures to spatially overlap the magneto-resistive sensors and the magnetic flux concentrators, it is possible to reset the magnetized direction of the magneto-resistive sensors and the magnetic flux concentrators and thus obtaining a smaller size, and it is possible to further eliminate the residual magnetism in the magneto-resistive sensors and the magnetic flux concentrators, thus obtaining an accurate sensing result. Additionally, the magnetic field sensing device and the magnetic field sensing apparatus in the embodiment of the invention are adapted for wafer level packaging technique.

In order to make the aforementioned features and advantages of the invention more comprehensible, embodiments accompanying figures are described in detail below.

BRIEF DESCRIPTION OF THE DRAWINGS

FIG. 8A to FIG. 10A are schematic top views of a magnetic field sensing apparatus according to different embodiments of the invention.

FIG. 8B to FIG. 10B are schematic top views of modified embodiment of the magnetic field sensing apparatus in FIG. 8A to FIG. 10A.

DESCRIPTION OF EMBODIMENTS

Figure 1A:
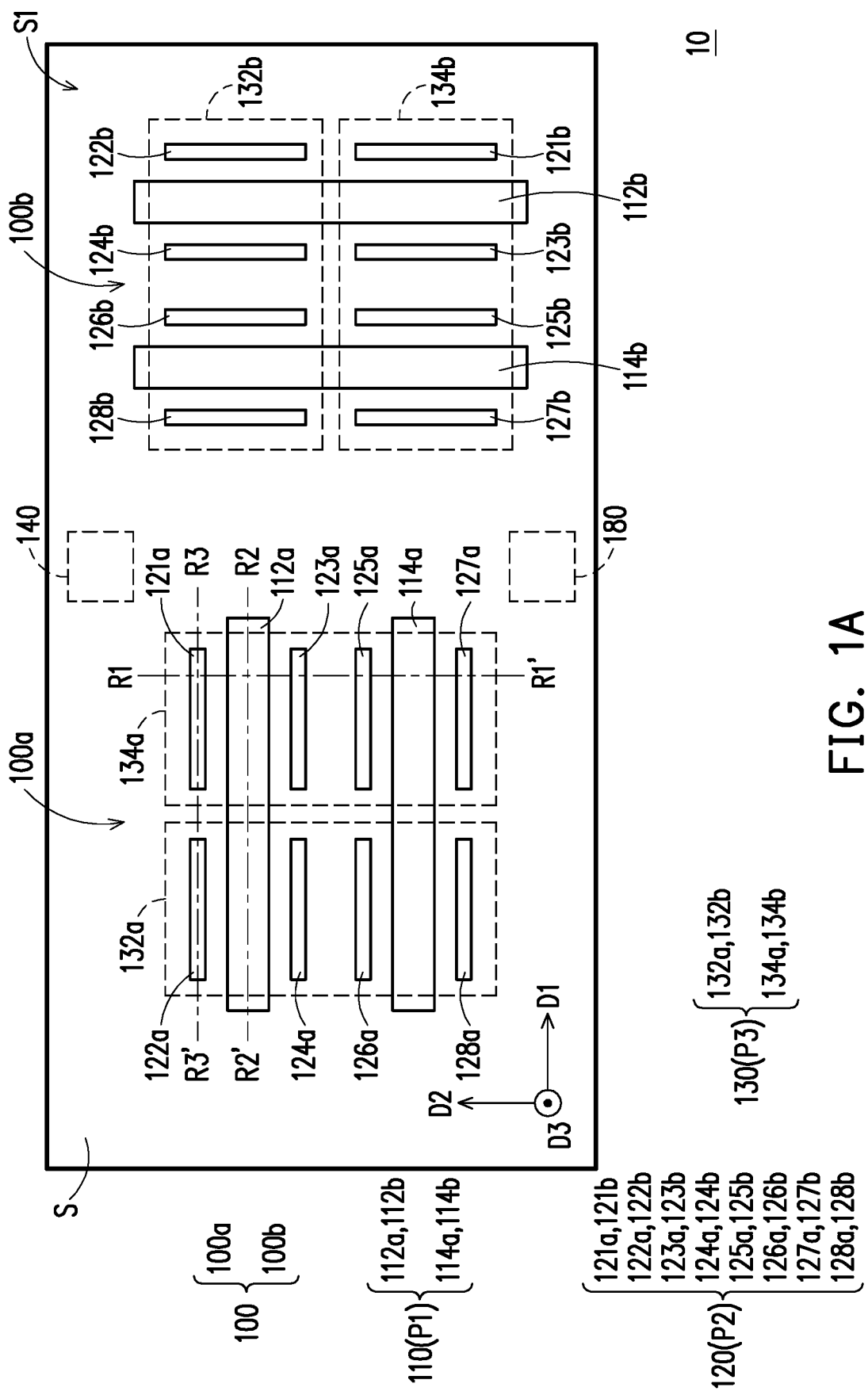
FIG. 1A is a schematic top view of a magnetic field sensing apparatus according to an embodiment of the invention.
Figure 1B:
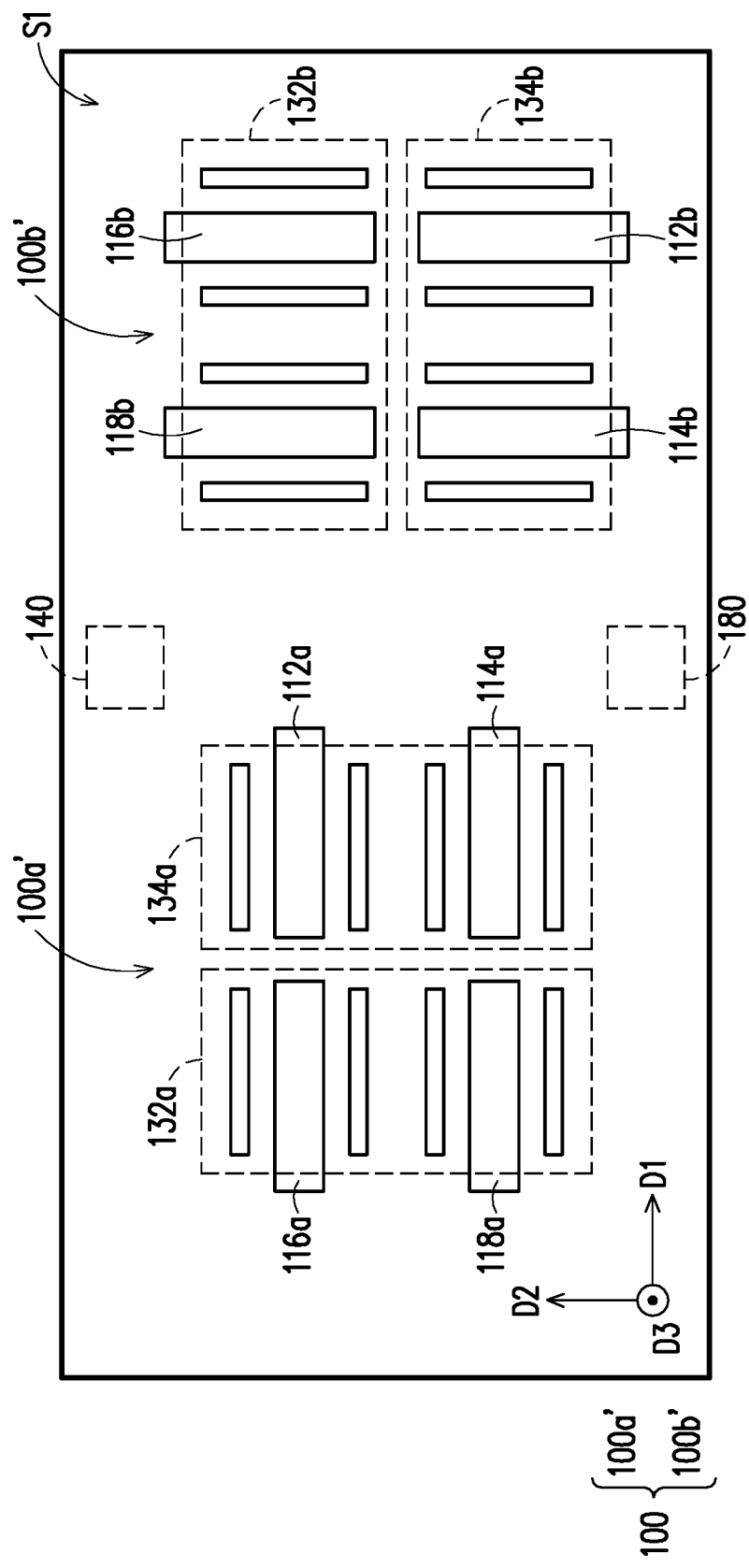
FIG. 1B is a schematic top view of a modified embodiment of FIG. 1A.
Figure 2A:
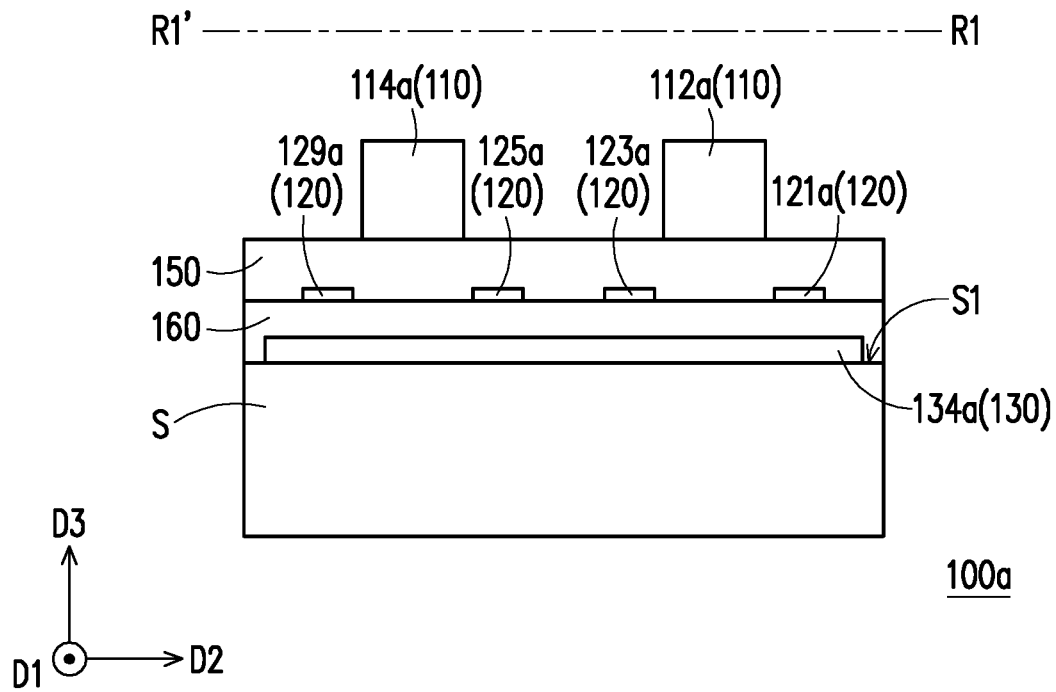
FIG. 2A to FIG. 2C are schematic cross-sectional views of different aspects of embodiment of FIG. 1A along cross-sectional line R1-R1'.
Figure 2B:
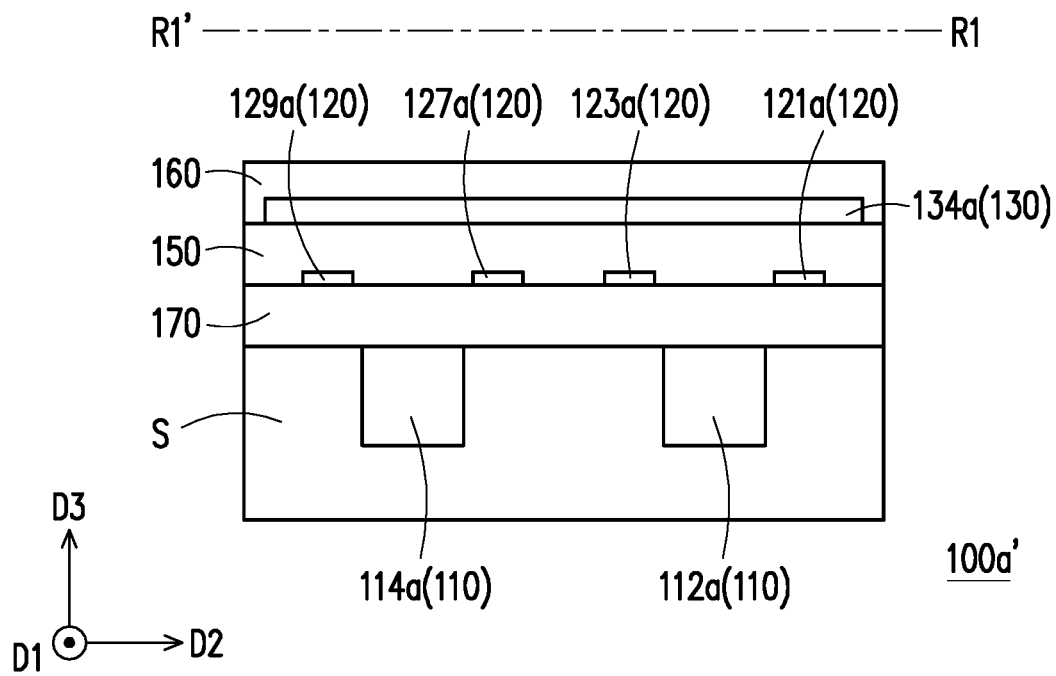
Figure 2C:
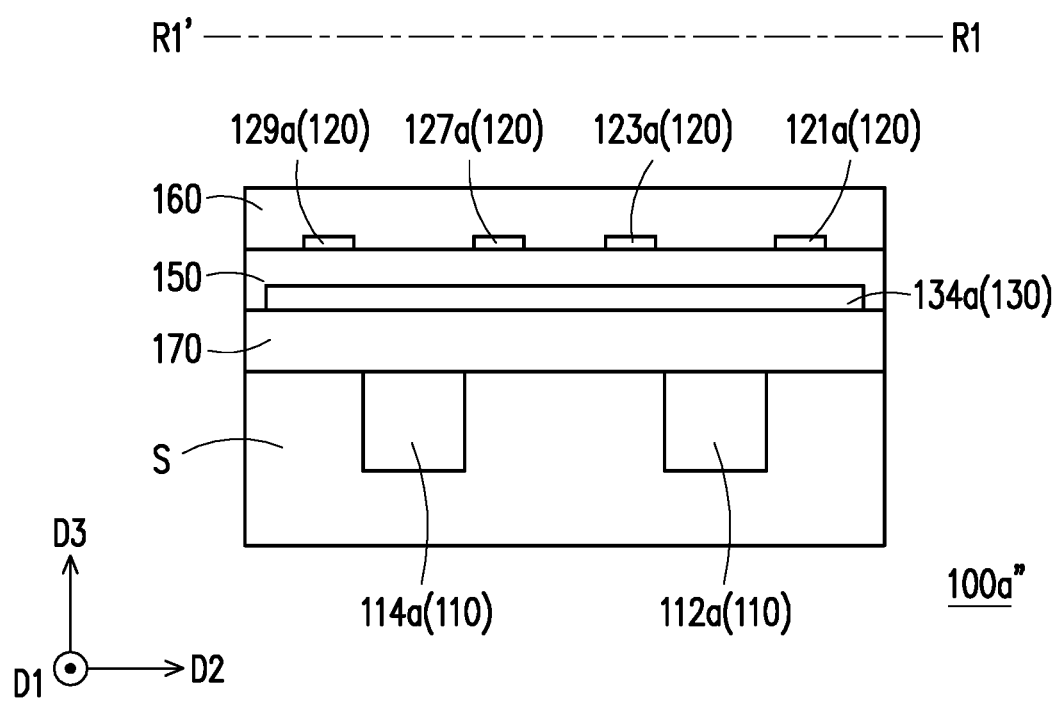

FIG. 1A is a schematic top view of a magnetic field sensing apparatus according to an embodiment of the invention. FIG. 1B is a schematic top view of a modified embodiment of FIG. 1A. FIG. 2A to FIG. 2C are schematic cross-sectional views of different aspects of embodiment of FIG. 1A along cross-sectional line R1-R1'. The shape and size of each of the devices in the drawings serve as examples only, the invention is not limited thereto.

Referring to FIG. 1A and FIG. 2A, in the embodiment of the invention, a magnetic field sensing apparatus 10 may sense a magnetic field component of an external magnetic field in 3-axis direction, which includes a plurality of magnetic field sensing devices 100 (two magnetic field sensing devices 100a and 100b are illustrated as an example). Each of the magnetic field sensing devices 100 includes a substrate S, a plurality of magnetic flux concentrators 110, a plurality of magneto-resistive sensors 120, a plurality of magnetic setting structures 130, a current generator 140 and insulating layers 150 and 160. Each of the magnetic field sensing devices 100 includes, for example, two magnetic flux concentrators 112 and 114, eight magneto-resistive sensors 121-128 and two magnetic setting structures 132 and 134, but not limited thereto. The alphabets a and b following the reference numerals in the drawings represent an attribution relationship. For example, 130a represents a magnetic setting structure of the magnetic field sensing device 100a, and the same rule applies to the rest of reference numerals. Details of each of the devices are provided below.

The magnetic flux concentrators 110 in the embodiment of the invention refers to a device capable of concentrating the magnetic field line of magnetic field. The material of the magnetic flux concentrator 110 is, for example, a ferromagnetic material having high permeability such as nickle-iron alloy, cobalt-iron or cobalt-iron-boron alloy, a ferrite, or other material having high permeability, but not limited thereto.

The magneto-resistive sensor 120 described in the embodiment of the invention refers to a sensor of which the resistance is changed corresponding to change of an external magnetic field. The magneto-resistive sensor 120 may be an anisotropic magneto-resistive resistor (AMR), a tunneling magnetoresistance (TMR) sensor or a giant mangetoresistance (GMR) sensor and the like, the invention is not limited thereto. In the embodiment, the magneto-resistive sensor 120 is an anisotropic magneto-resistive sensor.

The magnetic setting structure 130 described in the embodiment of the invention may refer to any one of coil, wire, metal sheet or conductor that generates a magnetic field through conduction.

The current generator 140 described in the embodiment of the invention refers to an electronic device configured to supply current.

A surface S1 of the substrate S is a plane, and the substrate S is, for example, a blank silicon substrate, a glass substrate or silicon substrate having a very large scale integrated-circuit (VLSI) or a large scale integrated-circuit (LSI), the invention is not limited thereto.

The material of the insulating layers 150 and 160 is, for example, silicon dioxide, aluminum oxide, aluminum nitride, silicon nitride or other material having insulating function, the invention is not limited thereto.

The configuration of each of the devices in the magnetic field sensing apparatus 10 of the embodiment is described in details below. Since the magnetic field sensing device 100a and the magnetic field sensing device 100b are the same in terms of structure, and the only difference between the two lies in the configuration, the following paragraph only describes the magnetic field sensing device 100a for exemplary purpose.

In order to easily describe the magnetic field sensing apparatus 10 and the magnetic field sensing device 100 in the embodiment, the space where the apparatus and the device are located is, for example, a Cartesian coordinate system defined by directions D1, D2 and D3. The direction D1 and the direction D2 are two adjacent sides parallel with the substrate S respectively, and the direction D3 is, for example, a surface S1 perpendicular to the substrate S. The directions D1, D2 and D3 are perpendicular to each other.

Referring to FIG. 1A, in the magnetic field sensing device 100a, each of the magnetic flux concentrators 110 is extended along direction D and arranged along the direction D2. At least a portion of the magneto-resistive sensors 120 is disposed on two opposite sides of each of the magnetic flux concentrators 110. For example, the magneto-resistive sensors 121a and 122a and the magneto-resistive sensors 123a and 124a are respectively disposed at upper and lower sides of the magnetic flux concentrators 112a. The magneto-resistive sensors 125a and 126a as well as the magneto-resistive sensors 127a and 128a are respectively disposed at upper and lower sides of the magnetic flux concentrators 114a. Each of the magneto-resistive sensors 120 is extended along the direction D1, and the magneto-resistive sensors 121a-128a are arranged along direction D2. The sensing direction of the magneto-resistive sensors 121a-128a are perpendicular to an extending direction D1, and the sensing direction is, for example, the direction D2. Each of the magnetic setting structures 130 is extended in the direction D2, and the magnetic setting structures 132a and 134a are arranged along the direction D1. The current generator 140 is disposed in the substrate S, coupled to the magneto-resistive sensor 120 and the magnetic setting structures 130, and configured to supply current to the magneto-resistive sensor 120 or the magnetic setting structures 130.

Referring to FIG. 2A, viewing from the cross-sectional view of the magnetic field sensing device 100a, the magnetic flux concentrators 110, the magneto-resistive sensors 120, the magnetic setting structures 130 and the insulating layers 150 and 160 are disposed on the substrate S. The magneto-resistive sensors 120 and the magnetic setting structures 130 are coupled to the substrate S. In the embodiment, the magneto-resistive sensors 120 are located in the same layer. The magnetic flux concentrators 110 are disposed at the upper side of the magneto-resistive sensors 120, and the magnetic setting structures 130 are disposed at the lower side of the magneto-resistive sensors 120. The insulating layer 150 covers the magneto-resistive sensors 120 such that the magneto-resistive sensors 120 are electrically insulated from other layers. The insulating layer 160 covers the magnetic setting structures 130 such that the magnetic setting structures 130 are electrically insulated from other layers. The magnetic flux concentrators 110 are disposed on the insulating layer 150 and exposed to the outside.

It should be indicated that the magnetic flux concentrators 110, the magneto-resistive sensors 120 and the magnetic setting structures 130 may be disposed differently from the configuration of FIG. 2A. Persons having ordinary skill in the art can make appropriate modification depending on actual needs and design. Referring to FIG. 2B and FIG. 2C, the schematic cross-sectional views of two magnetic field sensing devices 100a' and 100a" are respective modifications of the schematic cross-sectional view of the magnetic field sensing device 100a in FIG. 2A. The arrangement viewing from the top views of the two is the same as the arrangement viewing from the top view of the magnetic field sensing device 100a in FIG. 1A. The following paragraph only describes the difference shown in the cross-sectional view.

Referring to FIG. 2B, as compared with the magnetic field sensing device 100a, the magnetic field sensing device 100a' further includes an insulating layer 170. In the embodiment, the magnetic flux concentrators 110 are disposed at the lower side of the magneto-resistive sensors 120 and buried in the substrate S. The magnetic setting structures 130 are disposed at the upper side of the magneto-resistive sensors 120. The insulating layer 170 is disposed between the insulating layer 150 and the substrate S such that the magnetic flux concentrators 110 are electrically insulated from the devices in other layers.

Referring to FIG. 2C, as compared with the magnetic field sensing device 100a, in the magnetic field sensing device 100a", the magnetic flux concentrators 110 and the magnetic setting structures 130 are disposed at the lower side of the magneto-resistive sensors 120. The magnetic flux concentrators 110 are buried in the substrate S. The insulating layer 170 is disposed between the insulating layer 150 and the substrate S.

Referring to FIG. 1A, FIG. 2A to FIG. 2C, an orthogonal projection region of each of the magnetic flux concentrators 110 on the substrate S is a first orthogonal projection region P1. At least a portion of the magneto-resistive sensors 120 on the substrate S is a second orthogonal projection region P2. An orthogonal projection region of each of the magnetic setting structures 130 on the substrate S is a third orthogonal projection region P3. The third orthogonal projection region P3 at least overlaps the first orthogonal projection region P1 and at least a portion of the second orthogonal projection region P2 respectively. Specifically, the orthogonal projection region P3 of the magnetic setting structure 132a overlaps the orthogonal projection region P1 of the magnetic flux concentrators 112a and 114a and at least a portion of the orthogonal projection region P2 of at least a portion 122a, 124a, 126a and 128a of the magneto-resistive sensors 121a-128a respectively. The orthogonal projection region P3 of the magnetic setting structure 134a at least overlaps the orthogonal projection region P1 of the magnetic flux concentrators 112a and 114a and at least a portion of the orthogonal projection region P2 of at least a portion 121a, 123a, 125a and 127a of the magneto-resistive sensors 121a-128a respectively. Moreover, in the embodiment, the first orthogonal projection regions P1 do not overlap the second orthogonal projection regions P2. In other words, the first orthogonal projection regions P1 and the second orthogonal projection regions P2 are staggered.

On the other hand, the construction of the magnetic field sensing device 100b is similar to the construction of the magnetic field sensing device 100a, and the main difference lies in configuration. For example, the configuration of the magnetic field sensing device 100b is equivalent to the magnetic field sensing device 100a rotated by 90 degrees in counter-clock direction. Other related descriptions may be derived from the descriptions regarding the magnetic field sensing device 100a and deduced from the drawings and thus omitted hereinafter.

The following paragraph describes working principle of each of the components in the magnetic field sensing device 100a in details.

Figure 3A:
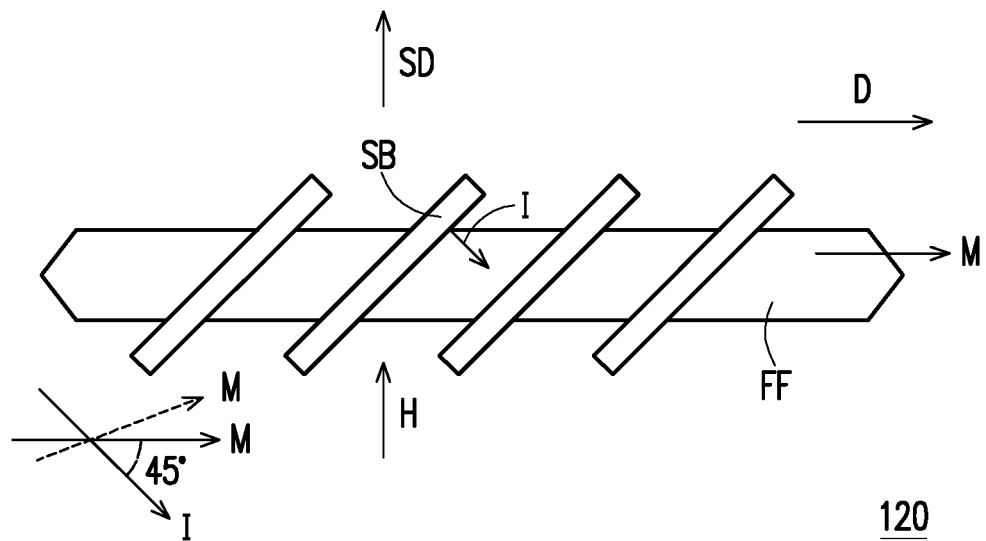
FIG. 3A and FIG. 3B illustrate different layouts of anisotropic magneto-resistive resistor in FIG. 1A.
Figure 3B:
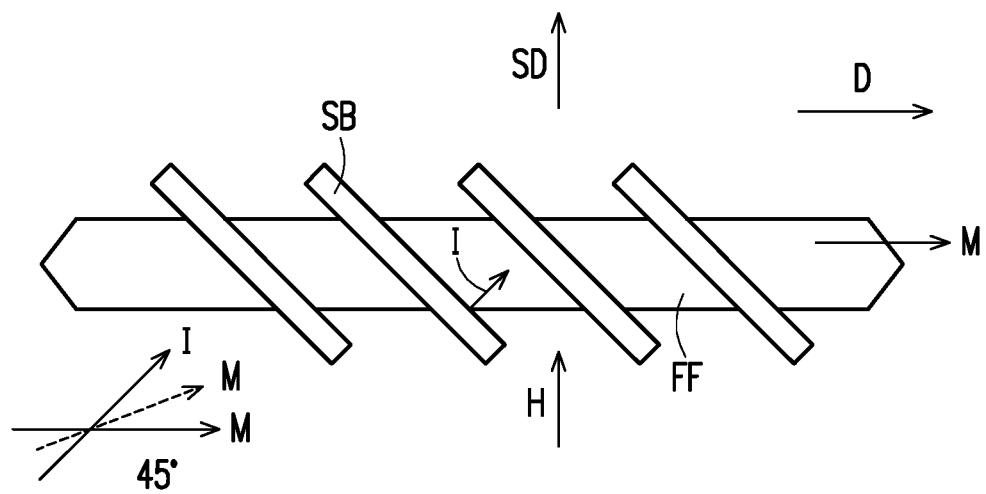

FIG. 3A and FIG. 3B illustrate different layouts of anisotropic magneto-resistive sensor in FIG. 1A.

Referring to FIG. 3A and FIG. 3B, the anisotropic magneto-resistive sensor 120, for example, has the barber pole structure, and the surface thereof is provided with a plurality of electrical shorting bars SB inclinedly extending at 45 degrees with respect to the extending direction D of the anisotropic magneto-resistive sensor 120. The electrical shorting bars SB are spaced apart from each other and disposed on a ferromagnetic film (FF) in parallel. The ferromagnetic film FF is a body of the anisotropic magneto-resistive sensor 120, and the extending direction thereof is the extending direction of the anisotropic magneto-resistive sensor 120. The sensing direction SD of the anisotropic magneto-resistive sensor 120 is perpendicular to the extending direction D. Additionally, two opposite ends of the ferromagnetic film FF may be formed as a tapered shape.

The magnetized direction of the anisotropic magneto-resistive sensor 120 may be set through the magnetic setting structure 130 before the external magnetic field H is measured. In FIG. 3A, the magnetic setting structure 130 may generate a magnetic field along the extending direction D through conduction such that the anisotropic magneto-resistive sensor 120 has a magnetized direction M.

Next, the magnetic setting structure 130 is not conducted such that the anisotropic magneto-resistive sensor 120 starts to measure the external magnetic field H. When there is no external magnetic field H, the magnetized direction M of the anisotropic magneto-resistive sensor 120 is maintained in the extending direction D. At this time the current generator 140 may apply a current I such that the current I flows from the left end to the right end of the anisotropic magneto-resistive sensor 120, and the flowing direction of the current I near the electrical shorting bar SB is perpendicular to the extending direction of the electrical shorting bar SB, such that an included angle of 45 degrees is formed between the flowing direction of the current I near the electrical shorting bar SB and the magnetized direction M. At this time, the resistance of the anisotropic magneto-resistive sensor 120 is R.

When an external magnetic field H faces the direction perpendicular to the extending direction D, the magnetized direction M of the anisotropic magneto-resistive sensor 120 is deflected toward the direction of the external magnetic field H, such that an included angle between the magnetized direction and flowing direction of the current I near the electrical shorting bar is larger than 45 degrees. At this time, the resistance of the anisotropic magneto-resistive sensor 120 exhibits a change of $-\Delta R$, and thus becoming $R-\Delta R$, which represents that the resistance is smaller, wherein $\Delta R$ is larger than 0.

However, as shown in FIG. 3B, when the extending direction of the electrical shorting bar SB in FIG. 3B is disposed in the direction that forms an included angle of 90 degrees with the extending direction of the electrical shorting bar SB of FIG. 3A (at this time the extending direction of the electrical shorting bar SB in FIG. 3B forms the included angle of 45 degrees with the extending direction D of the anisotropic magneto-resistive sensor 120), and when there is an external magnetic field H, the external magnetic field H stills makes the magnetized direction M to deflect toward the direction of the external magnetic field H. At this time, the include angle between the magnetized direction M and the flowing direction of the current I near the electrical shorting bar SB is smaller than 45 degrees. In this manner, the resistance of the anisotropic magneto-resistive sensor 120 becomes $R+\Delta R$, that is, the resistance of the anisotropic magneto-resistive sensor 120 is larger.

Additionally, by setting the magnetized direction M of the anisotropic magneto-resistive sensor 120 to be opposite to the direction shown in FIG. 3A through the magnetic setting structure 130, the resistance of the anisotropic magneto-resistive sensor 120 in FIG. 3A under the external magnetic field H becomes $R+\Delta R$ afterwards. Moreover, by setting the magnetized direction M of the anisotropic magneto-resistive sensor 120 to be opposite to the direction shown in FIG. 3B through the magnetic setting structure 130, the resistance of the anisotropic magneto-resistive sensor 120 in FIG. 2B under the external magnetic field H becomes $R-\Delta R$.

In summary of the above, when the configuration direction of the electrical shorting bar SB is changed, the resistance R of the anisotropic magneto-resistive sensor 120 is changed from $+\Delta R$ to $-\Delta R$ or vice versa corresponding to the change of the external magnetic field H. When the magnetized direction M set by the magnetic setting structure 130 is changed to an opposite direction, the resistance R of the anisotropic magneto-resistive sensor 120 is changed from $+\Delta R$ to $-\Delta R$ or vice versa corresponding to the change of the external magnetic field H. When the direction of the external magnetic field H is changed into an opposite direction, the resistance R of the anisotropic magneto-resistive sensor 120 is changed from $+\Delta R$ into $-\Delta R$ or vice versa corresponding to the change of the external magnetic field H. However, when the current I passing through the anisotropic magneto-resistive sensor 120 is changed into the opposite direction, the resistance R of the anisotropic magneto-resistive sensor 120 maintains to be the same sign corresponding to the change of the external magnetic field H; that is, if the resistance R is $+\Delta R$, it is still $+\Delta R$ after the current direction is changed, if the original resistance R is $-\Delta R$, it is still $-\Delta R$ after the current direction is changed.

Based on the above principle, it is possible to use the extending direction D of the electrical shorting bar SB or the magnetized direction M set by the magnetic setting structure 130 to determine the changing direction of the resistance R of the anisotropic magneto-resistive sensor 120, i.e., whether the resistance R becomes larger or smaller, for example the amount of change is $+\Delta R$ or $-\Delta R$, when the anisotropic magneto-resistive sensor 120 is subjected to a component of the external magnetic field H.

Figure 4A:
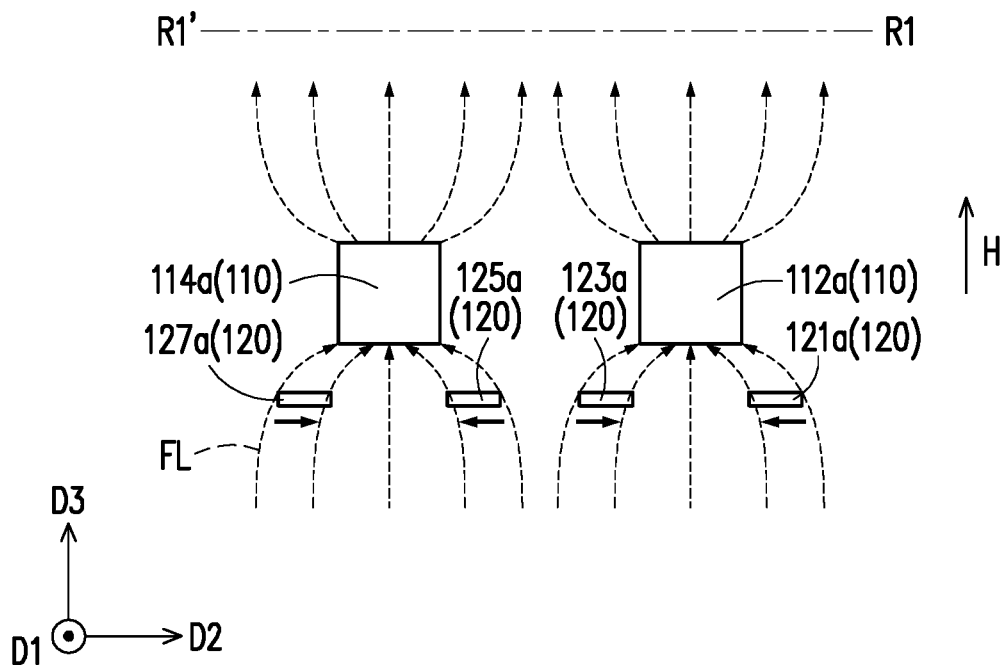
FIG. 4A and FIG. 4B are schematic views of a magneto-resistive sensor and a magnetic flux concentrator in FIG. 1A under the effect of an external magnetic field.
Figure 4B:
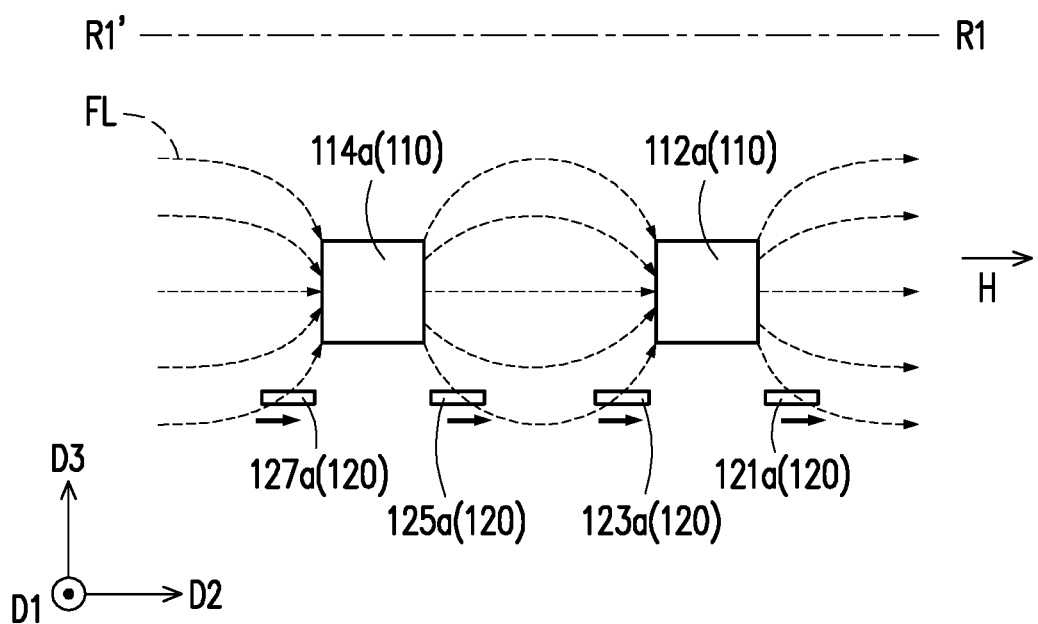

FIG. 4A and FIG. 4B are schematic views of a magneto-resistive sensor and a magnetic flux concentrator in FIG. 1A under the effect of an external magnetic field. Herein, the magneto-resistive sensor and the magnetic flux concentrator taken along cross-sectional line R1-R1' are illustrated for exemplary purpose and the rest may be deduced from the above; related descriptions are omitted hereinafter.

Referring to FIG. 4A, when the external magnetic field H parallel with the direction D3 is applied to the magnetic field sensing device 100a, the magnetic field line FL is concentrated toward the direction of the magnetic flux concentrator 110 from the left and right sides of the magnetic flux concentrator 110 due to the high permeability of the magnetic flux concentrator 110 relative to air. Therefore, the magnetic field line FL generates a phenomenon similar to being bent. The bent external magnetic field H generates two opposite magnetic field components (e.g., indicated by black arrow shown in the drawing) on the anisotropic magneto-resistive sensor 120 (exemplified as 127a, 125a) on two opposite sides of the magnetic flux concentrator 110. By using subtraction, the related signal exhibiting magnitude of the magnetic field component (not shown) of the bent external magnetic field H in direction D3 may be obtained, and the related signal exhibiting the magnitude of the magnetic field component of the bent external magnetic field H in direction D2 may be cancelled.

Referring to FIG. 4B, when the external magnetic field H is applied to the magnetic field sensing device 100a in the direction D2, the magnetic field line FL is concentrated toward the direction of the magnetic flux concentrator 110 from the upper and lower sides of the magnetic flux concentrator 110. The bent external magnetic field H generates two magnetic fields (indicated by black arrow in the drawing) having the same direction on the magneto-resistive sensor 120 (exemplified as 127a and 125a) on two opposite sides of the magnetic flux concentrator 110. By using addition, the related signal exhibiting magnitude of the magnetic field component (not shown) of the bent external magnetic field H in the direction D3 may be cancelled, and the magnitude of the magnetic field component of the bent external magnetic field H in the direction D2 may be obtained.

Figure 5A:
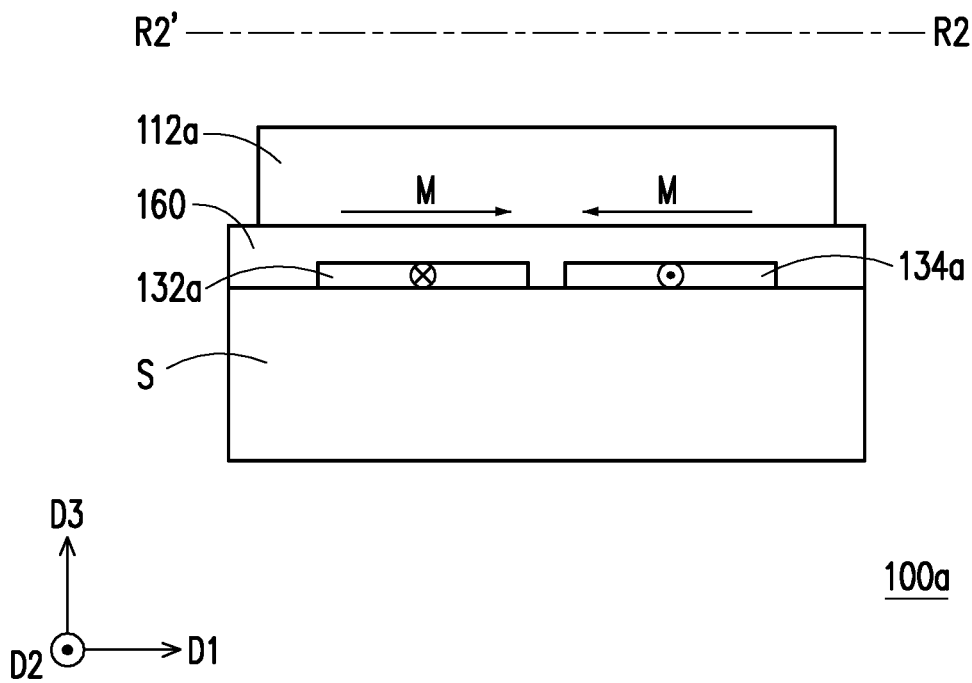
FIG. 5A is a schematic view illustrating a magnetic setting structure which sets magnetized direction of a magnetic flux concentrator along cross-sectional line R2-R2'.
Figure 5B:
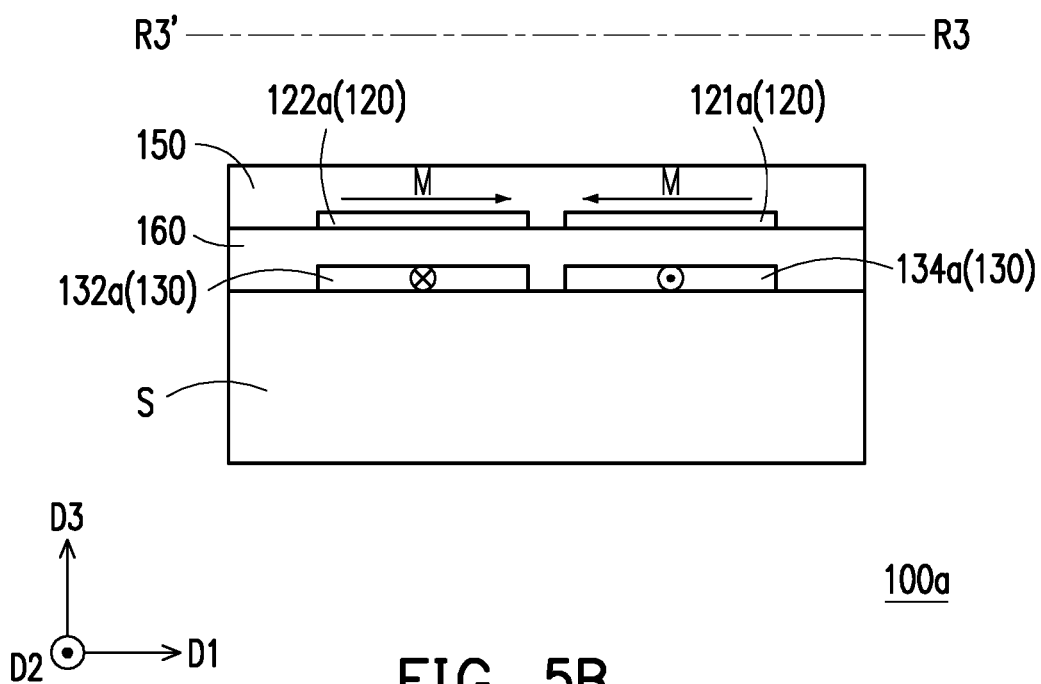
FIG. 5B is a schematic view illustrating a magnetic setting structure which sets magnetized direction of a magneto-resistive sensor along cross-sectional line R3-R3'.
Figure 5C:
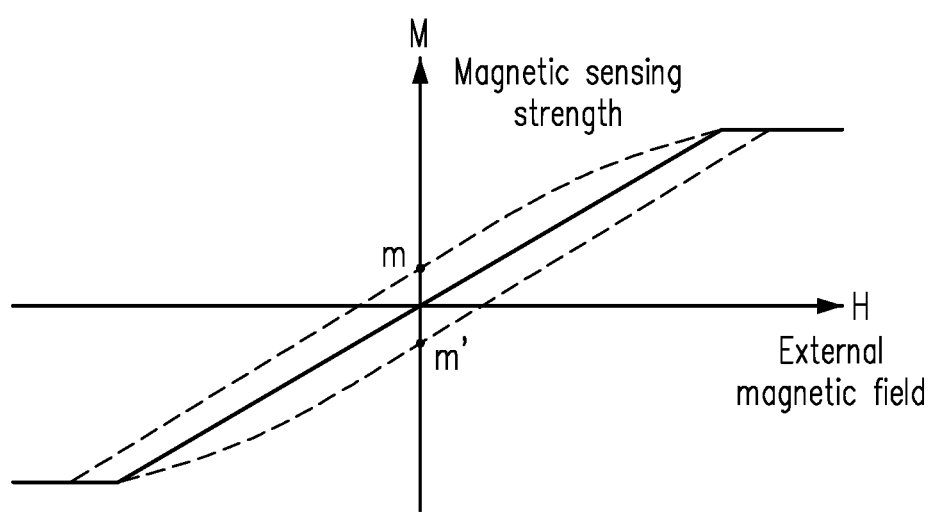
FIG. 5C illustrates a hysteresis curve measured from a magneto-resistive sensor and a magnetic flux concentrator in direction D2.

FIG. 5A is a schematic view illustrating a magnetic setting structure which sets magnetized direction of a magnetic flux concentrator along cross-sectional line R2-R2'. FIG. 5B is a schematic view illustrating a magnetic setting structure which sets magnetized direction of a magneto-resistive sensor along cross-sectional line R3-R3'. FIG. 5C illustrates a hysteresis curve measured from a magneto-resistive sensor and a magnetic flux concentrator in direction D2.

Referring to FIG. 5A, in the embodiment, the current generator 140 is adapted to supply two currents having opposite directions (or referred to that the two currents are anti-parallel to each other) to different magnetic setting structures 132a and 134a. Specifically, the current generator 140 may supply a current (marked as ⊗) having a current direction opposite to the direction D2 to the magnetic setting structure 132a, and supply a current (marked as ⊙) having a current direction same as the direction D2 to the magnetic setting structure 134a. Accordingly, for the magnetic flux concentrator 112a, the magnetic setting structures 132a and 134a may generate an opposite magnetic field (e.g., denoted by arrow in FIG. 5A) in different regions of the magnetic flux concentrator 112a according to the conditions provided by above currents. When the current is removed, the magnetic flux concentrator 112a may be non-magnetized. Likewise, the magnetic setting structures 132a and 134a may perform the above-mentioned step on the magnetic flux concentrator 114a.

Based on similar current providing condition described in FIG. 5A, referring to FIG. 5B, in the embodiment, for magneto-resistive sensors 121a and 122a, the magnetic setting structure 132a generates a magnetic field along direction D1 on the magneto-resistive sensor 122a. Likewise, the magnetic setting structure 132a also generates a magnetic field along direction D1 on the magneto-resistive sensors 124a, 126a and 128a. The magnetic setting structure 134a generates a magnetic field having a direction opposite to the direction D1 on the magneto-resistive sensor 121a. Likewise, the magnetic setting structure 134a also generates a magnetic field along a direction opposite to the direction D1 on the magneto-resistive sensors 123a, 125a and 127a.

FIG. 5A and FIG. 5B are cross-sectional views of the magnetic field sensing device 100a in FIG. 2A. In other embodiments that are not shown, it is possible to perform the magnetic setting as shown in FIG. 5A and FIG. 5B on the magnetic field sensing devices 100a' and 100a" in FIG. 2B and FIG. 2C, the invention is not limited thereto.

Referring to FIG. 5C, a transverse axis represents intensity of the external magnetic field H, a longitudinal axis is a magnetic sensing strength of the device in direction D2, wherein m point represents the residual magnetism sensing strength of the magnetic flux concentrator 110 in the direction D2, and m' point represents the residual magnetism sensing strength of the magneto-resistive sensor 120 in the direction D2. When the external magnetic field is not zero, the magnetic flux concentrator 110 or the magneto-resistive sensor 120 increases or reduces the magnetic sensing strength in the manner shown in dashed line but not in the physical line. The magnetic sensing strength deviation between the physical line and the dashed line causes error of sensing result.

Therefore, in the embodiment, it is possible to perform the magnetic setting shown in FIG. 5A and FIG. 5B to set the magnetized direction of the magnetic flux concentrator 110 or the magneto-resistive sensor 120 to be the direction D1 perpendicular to the sensing direction D2. Therefore, the effect of the residual magnetism sensing strength of either the magnetic flux concentrator 110 or the magneto-resistive sensor 120 in the sensing direction D2 may be reduced. The magnetic field sensing device 100a of the embodiment may have ultra-low output offset through the magnetic setting method described above and thus having accurate sensing result.

In continuation of the above, in the magnetic field sensing device 100a of the embodiment of the invention, since the orthogonal projection region P3 of the magnetic setting structure 130 on the substrate S at least overlaps the orthogonal projection region P1 of the magnetic flux concentrator 110 on the substrate S and at least a portion of the orthogonal projection region P2 of at least a portion of the magneto-resistive sensor 120 on the substrate S, with such configuration, the magnetic setting structure 130 may reset the magnetized direction of the magnetic flux concentrator 110 and the magneto-resistive sensor 120 simultaneously while having a smaller size. Specifically, by resetting the magnetized direction M to be the direction D1 perpendicular to the sensing direction D2, it is possible to effectively reduce the residual magnetism sensing strength with respect to the magnetic flux concentrator 110 and the magneto-resistive sensor 120 in the direction D2; therefore, the sensing result of the magnetic field sensing device 100a of the embodiment is more accurate.

In the following paragraph, it is exemplified how the magnetic field sensing apparatus 10 of the embodiment measures the intensity of the external magnetic field.

Figure 6A:
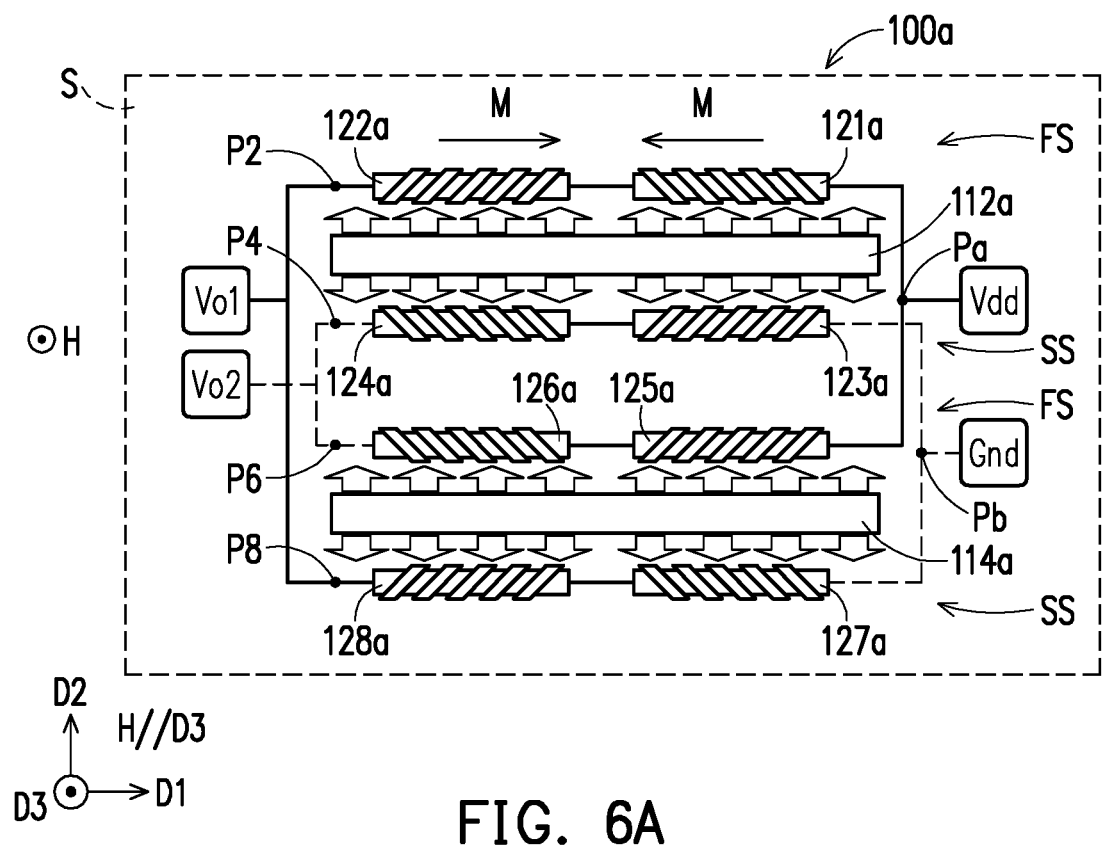
FIG. 6A and FIG. 6B are schematic views of a bridging method of a magneto-resistive sensor during a first time interval and a second time interval as well as a configuration direction of a suitable magneto-resistive electrical shorting bar and a configuration direction of a magnetized direction according to an embodiment of the invention.
Figure 6B:
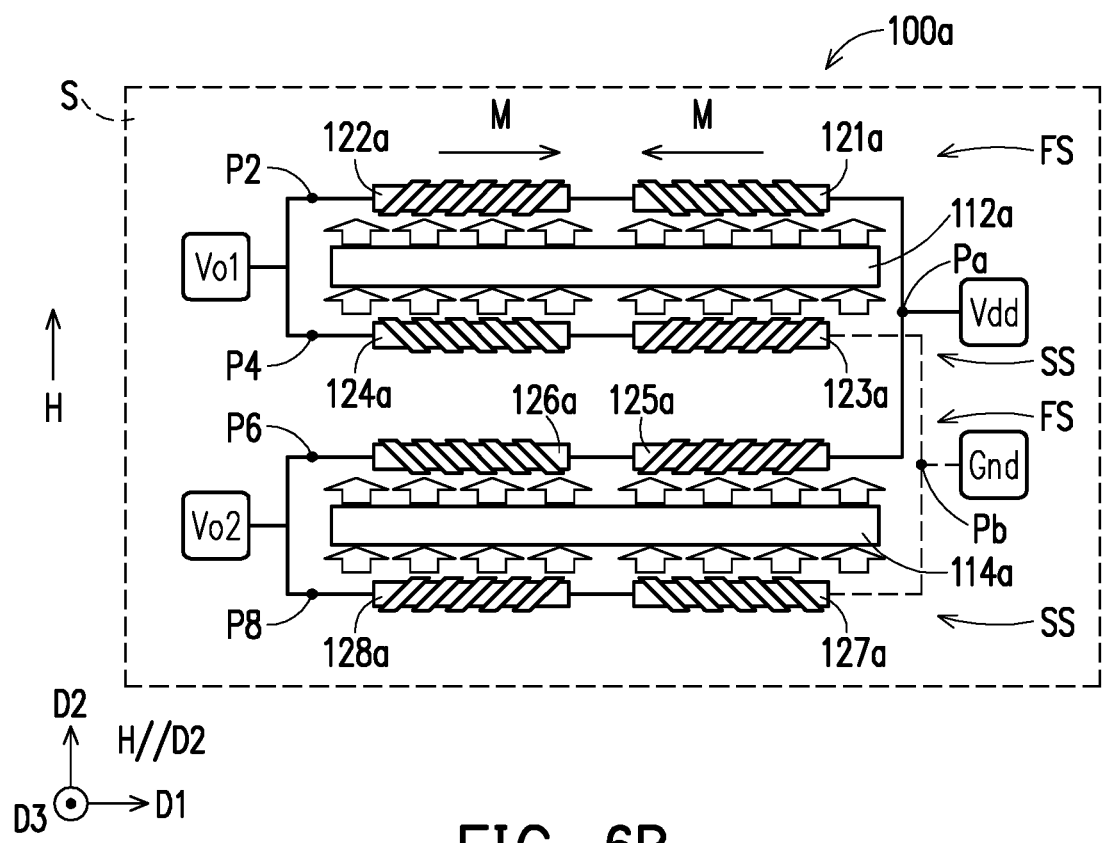
Figure 6C:
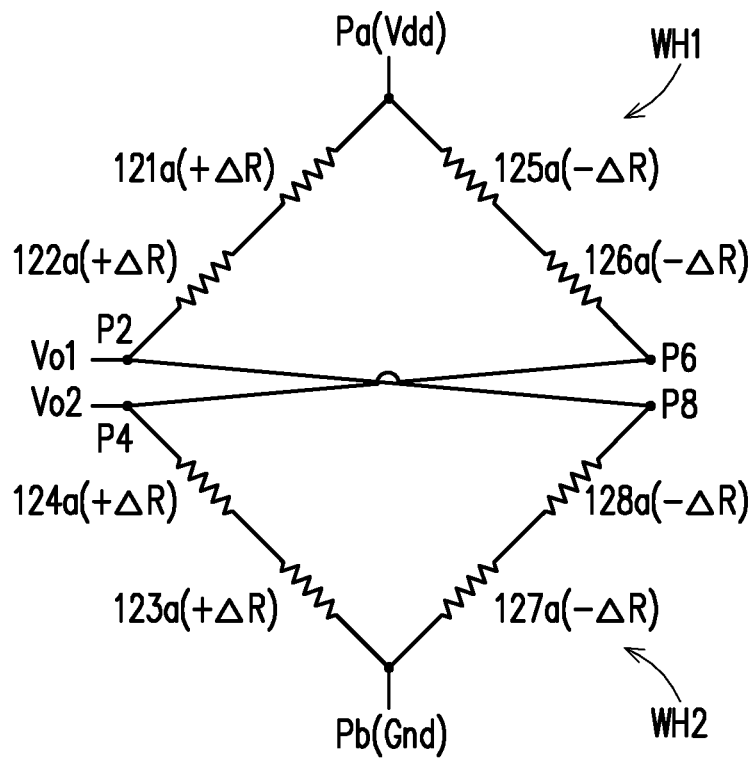
FIG. 6C is an equivalent circuit diagram showing a magnetic field sensing device in the embodiment of FIG. 6A measuring a magnetic field component in direction D3.
Figure 6D:
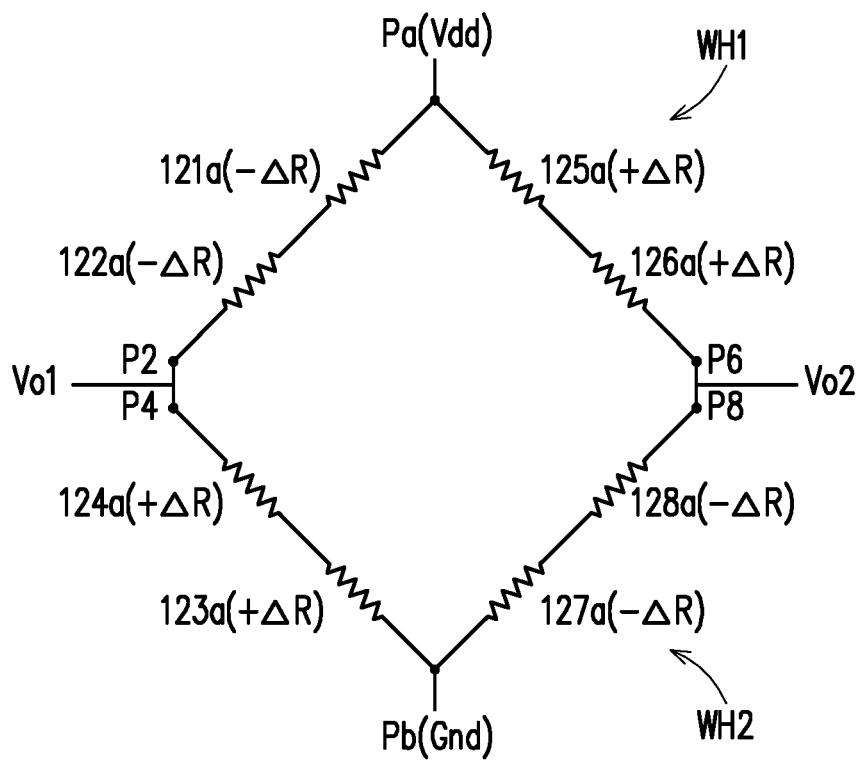
FIG. 6D is an equivalent circuit diagram showing a magnetic field sensing device in the embodiment of FIG. 6B measuring a magnetic field component in direction D2.

FIG. 6A and FIG. 6B are schematic views of a bridging method of a magneto-resistive sensor during a first time interval and a second time interval as well as a configuration direction of a suitable magneto-resistive electrical shorting bar and a configuration direction of a magnetized direction according to an embodiment of the invention. FIG. 6C is an equivalent circuit diagram showing a magnetic field sensing device in the embodiment of FIG. 6A measuring a magnetic field component in direction D3. FIG. 6D is an equivalent circuit diagram showing a magnetic field sensing device in the embodiment of FIG. 6B measuring a magnetic field component in direction D2.

Referring to FIG. 6A and FIG. 6B, in the embodiment, the magneto-resistive sensors 121a-128a may be connected through wire. With reference to the illustration in FIG. 5B, the magnetic setting structure 132a sets the magnetized direction M of the magneto-resistive sensors 122a, 124a, 126a and 128a as the direction D1, and the magnetic setting structure 134a sets the magnetized direction M of the magneto-resistive sensors 121a, 123a, 125a and 127a as the opposite direction of the direction D1. In other words, the magnetized directions M of a portion and another portion of the magneto-resistive sensors 120 are set as facing away from each other (or referred to as anti-parallel to each other). Thereafter, the inclined directions (e.g., from upper right to lower left) of the electrical shorting bars of the magneto-resistive sensors 122a, 123a, 125a and 128a are the same. The inclined directions (for example, from upper left to lower right) of the electrical shorting bars of the magneto-resistive sensors 121a, 124a, 126a and 127a are the same. In the embodiment, each of the magnetic flux concentrators 112a and 114a has a first side FS and the second side SS opposite to each other. At least a portion (121a, 122a, 125a, 126a) of the magneto-resistive sensors 121a-128a on the first side FS of each of the magnetic flux concentrators 112a and 114a form a first Wheatstone half bridge WH1. At least a portion (123a, 124a, 128a, 129a) of the magneto-resistive sensors 121a-128a on the second side SS of each of the magnetic flux concentrators form a second Wheatstone half bridge WH2. In the embodiment, the magnetic field sensing device 100a may be selectively provided with a switching circuit 180. The switching circuit 180 electrically connects the first and the second Wheatstone half bridges WH1l and WH2 to be two types of Wheatstone full bridges (see FIG. 6C and FIG. 6D) during different time intervals by switching contacts P2, P4, P6 and P8, thereby measuring magnetic field components in two different directions respectively, and the two types of Wheatstone full bridges output respectively correspond to two signals of the magnetic field components in two different directions.

Referring to FIG. 6A and FIG. 6C, during the first time interval, the switching circuit 180 electrically connects the contact P2 and the contact P8, and electrically connects the contact P4 and the contact P6, thereby forming the first type of Wheatstone full bridge. When the external magnetic field H parallel with the direction D3 is applied to the magnetic field sensing device 100a, the external magnetic field H is bent by the magnetic flux concentrators 112a and 114a, such that the magneto-resistive sensors 121a-128a sense the magnetic field component in the direction D2 and the direction D3 due to the bent magnetic field H (see FIG. 4A). The magneto-resistive sensors 121a-124a respectively generate resistance of +ΔR due to the effect of external magnetic field H. On the other hand, the magneto-resistive sensors 125a-128a respectively generate the resistance of −ΔR due to the effect of the external magnetic field H. In the embodiment, a contact Pa receives a reference voltage Vdd, a contact Pb is grounded (Gnd). The voltage values of the contacts P2 and P8 are Vo1. The voltage values of the contacts P6 and P4 are Vo2. The voltage difference between the voltage value Vo1 and the voltage value Vo2 may be an output signal, and the output signal is a differential signal. There is a linear relationship between the magnitude of the differential signal and the magnitude of the magnetic field component of the bent external magnetic field H in the direction D3, and thus the intensity of the external magnetic field H can be obtained. Additionally, the magnetic field components of the bent external magnetic field H in the directions D2 and D1 do not output signal under the Wheatstone full bridge.

Referring to FIG. 6B and FIG. 6D, during the second time interval, the switching circuit 180 electrically connects the contact P2 and the contact P4, and electrically connects the contact P6 and the contact P8, thereby forming the second type of Wheatstone full bridge. When the external magnetic field H parallel with the direction D2 is applied to the magnetic field sensing device 100a, the external magnetic field H is bent by the magnetic flux concentrators 112a and 114a, such that the magneto-resistive sensors 121a-128a sense the magnetic field components in the direction D2 and the direction D3 due to the bent external magnetic field H (see FIG. 4B). The magneto-resistive sensors 121a, 122a, 127a and 128a respectively generate resistance of −ΔR due to the effect of the external magnetic field H. On the other hand, the magneto-resistive sensors 123a, 124a, 125a and 126a respectively generate the resistance of +ΔR due to the effect of the external magnetic field H. In the embodiment, the contact Pa receives the reference voltage Vdd, and the contact Pb is grounded (Gnd). The voltage values of the contacts P2 and P4 are Vo1. The voltage values of the contacts P6 and P8 are Vo2. The voltage difference between the voltage value Vo1 and the voltage value Vo2 may be an output signal, and the output signal is a differential signal. There is a linear relationship between the magnitude of the differential signal and the magnitude of the magnetic field component of the bent external magnetic field H in the direction D2. Accordingly, the intensity of the external magnetic field H may be obtained. Additionally, the magnetic field components of the bent external magnetic field H in the directions D1 and D3 do not output signal under the Wheatstone full bridge.

Figure 7A:
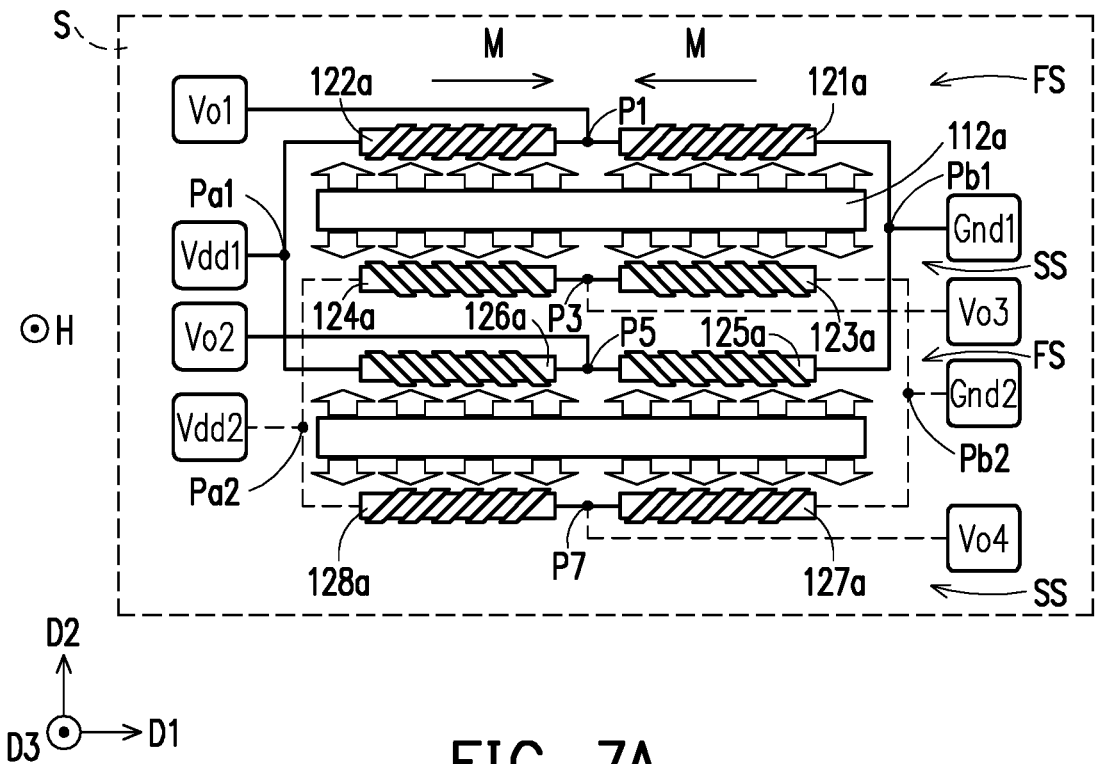
FIG. 7A and FIG. 7B are schematic views of a bridging method of a magneto-resistive sensor during a first time interval and a second time interval as well as a configuration direction of a suitable magneto-resistive electrical shorting bar and a configuration direction of a magnetized direction according to another embodiment of the invention.
Figure 7B:
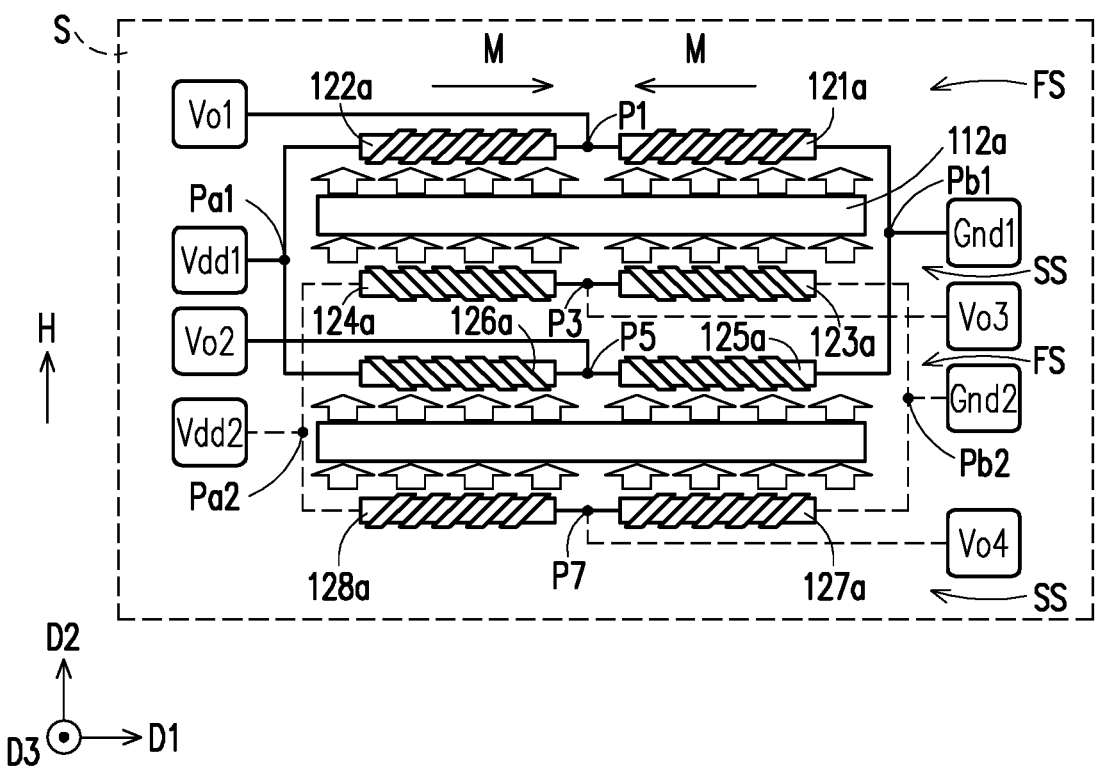
Figure 7C:
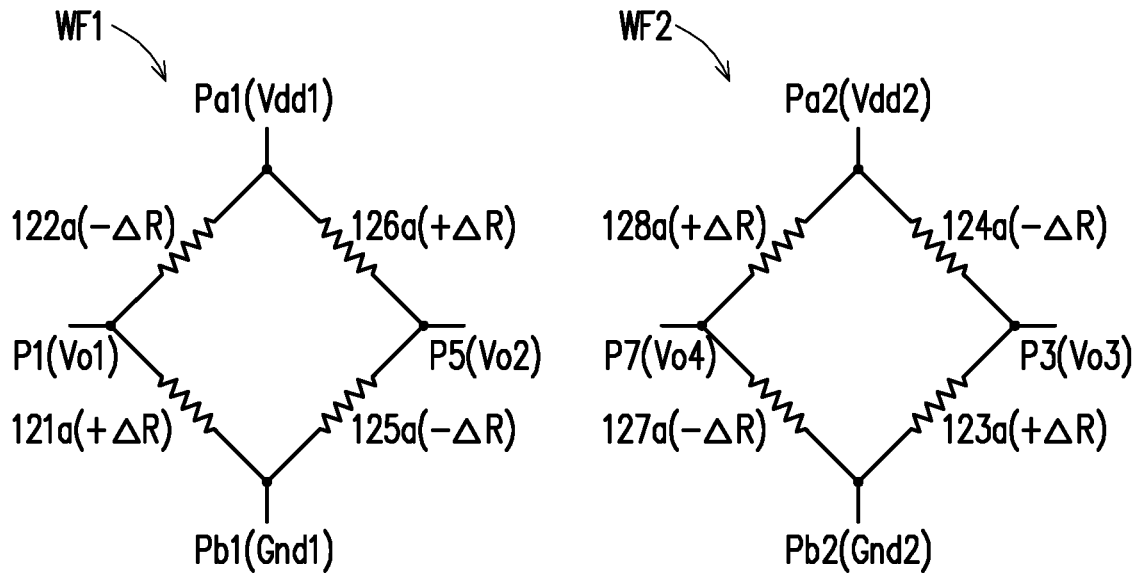
FIG. 7C is an equivalent circuit diagram showing a magnetic field sensing device in the embodiment of FIG. 7A measuring a magnetic field component in direction D3.
Figure 7D:
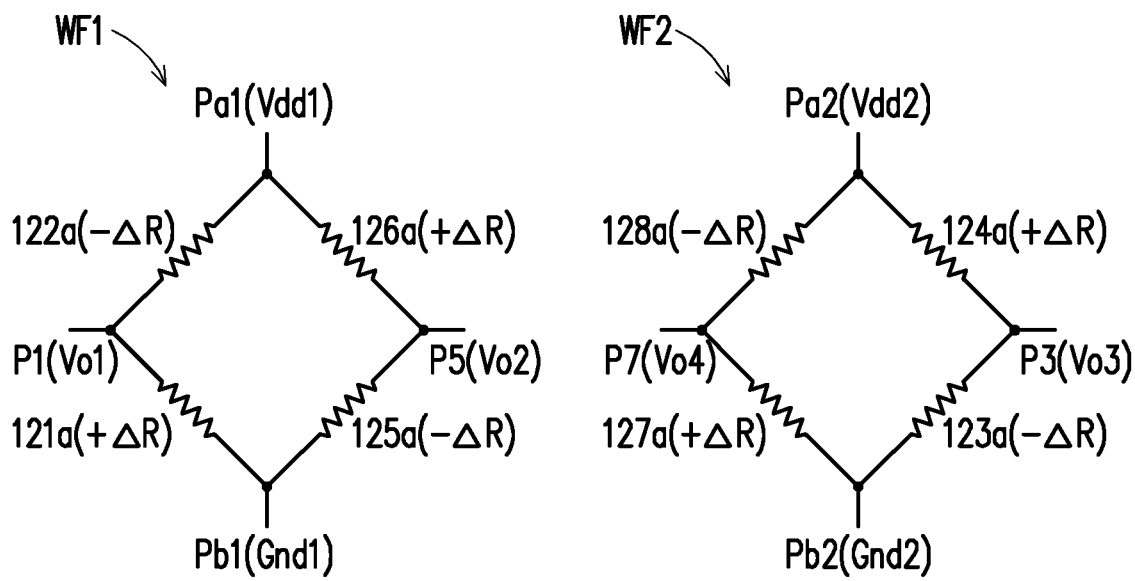
FIG. 7D is an equivalent circuit diagram showing a magnetic field sensing device in the embodiment of FIG. 7B measuring a magnetic field component in direction D2.

FIG. 7A and FIG. 7B are schematic views of a bridging method of a magneto-resistive sensor during a first time interval and a second time interval as well as a configuration direction of a suitable magneto-resistive electrical shorting bar and a configuration direction of a magnetized direction according to another embodiment of the invention. FIG. 7C is an equivalent circuit diagram showing a magnetic field sensing device in the embodiment of FIG. 7A measuring a magnetic field component in direction D3. FIG. 7D is an equivalent circuit diagram showing a magnetic field sensing device in the embodiment of FIG. 7B measuring a magnetic field component in direction D2.

The configurations in FIG. 7A to FIG. 7D are substantially similar to the configurations in FIG. 6A to FIG. 6D, and the main difference lies in the design of inclined direction of the electrical shorting bar and the circuit design. The difference is described below. Referring to FIG. 7A and FIG. 7B, the inclined directions (e.g., from upper right to lower left) of the electrical shorting bars of the magneto-resistive sensors 121a, 122a, 127a and 128a are the same.

The inclined directions (e.g., from upper left to lower right) of the electrical shorting bars of the magneto-resistive sensors 123a, 124a, 125a and 126a are the same. Thereafter, at least a portion (121a, 122a, 125a, 126a) of the magneto-resistive sensors 121a-128a at the first side FS of each of the magnetic flux concentrators 112a and 114a constitutes the first Wheatstone full bridge WF1. At least a portion (123a, 124a, 127a, 128a) of the magneto-resistive sensors 121a-128a at the second side SS of each of the magnetic flux concentrators forms the second Wheatstone full bridge WF2. Referring to FIG. 7A, in the first Wheatstone full bridge WF1, a contact Pa1 receives a reference voltage Vdd1, a contact Pb1 is grounded (Gnd1), the voltage value of the contact P1 is Vo1, and the voltage value of the contact P3 is Vo3. Referring to FIG. 7B, in the second Wheatstone full bridge WF2, a contact Pa2 receives a reference voltage Vdd2, a contact Pb2 is grounded (Gnd2), the voltage value of the point P3 is Vo3, and the voltage value of the contact P7 is Vo4. The voltage difference between the voltage value Vo1 and the voltage value Vo3 may be a first output signal of the first Wheatstone full bridge WF1. The voltage difference between the voltage value Vo3 and the voltage value Vo4 may be a second output signal of the second Wheatstone full bridge WF2. The first output signal and the second output signal are differential signals.

Referring to FIG. 7A and FIG. 7C, when the external magnetic field H parallel with the direction D3 is applied to the magnetic field sensing device 100a, the external magnetic field H is bent by the magnetic flux concentrators 112a and 114a such that the magneto-resistive sensors 121a-128a sense the magnetic field components in the direction D2 and the direction D3 due to the bent external magnetic field H. The magneto-resistive sensors 121a, 123a, 126a and 128a respectively generate the resistance of +ΔR due to the effect of the external magnetic field H. On the other hand, the magneto-resistive sensors 122a, 124a, 125a and 127a respectively generate resistance of −ΔR due to the effect of the external magnetic field H. The magnetic field sensing device 100a can obtain a sum signal by adding the first output signal and the second output signal. There is a linear relationship between the magnitude of the sum signal and the magnitude of the magnetic field component of the bent external magnetic field H in the direction D3. In this manner, the intensity of the external magnetic field H can be obtained. Additionally, the magnetic field component of the bent external magnetic field H in the direction D2 is cancelled due to the addition of the first and the second output signals. The magnetic field component of the bent external magnetic field H in the direction D1 does not output signal under the first and second Wheatstone full bridges WH1 and WH2.

Referring to FIG. 7B and FIG. 7D, when the external magnetic field H parallel with the direction D2 is applied to the magnetic field sensing device 100a, the external magnetic field H is bent by the magnetic flux concentrators 112a and 114a, such that the magneto-resistive sensors 121a-128a sense the magnetic field components in the direction D2 and the direction D3 due to the bent external magnetic field H. The magneto-resistive sensors 121a, 124a, 126a and 127a are affected by the external magnetic field H and respectively generate resistance of +ΔR. On the other hand, the magneto-resistive sensors 122a, 123a, 125a and 128a are affected by the external magnetic field H and respectively generate the resistance of −ΔR. The magnetic field sensing device 100a obtains a differential signal by subtracting the first output signal from the second output signal. The absolute values of the first output signal and the second output signal are the same but the signs are different. There is a linear relationship between the magnitude of the differential signal and the magnitude of the magnetic field component of the bent external magnetic field H in the direction D2. In this manner, the intensity of the external magnetic field H can be obtained. Additionally, the magnetic field component of the bent external magnetic field H in the direction D3 is cancelled due to subtraction of the first and the second output signals. The magnetic field component of the bent external magnetic field H in the direction D1 does not output signal under the first and the second Wheatstone full bridges WH1 and WH2.

In continuation to the above, the magnetic field sensing device 100a can measure the magnetic field in the directions D2 and D3 through the circuit configuration shown in FIG. 6A and FIG. 6B or FIG. 7A and FIG. 7B. Persons skilled in the art may refer to the above circuit configuration to form the magneto-resistive sensors 121b-128b in the magnetic field sensing device 100b as Wheatstone full bridge to measure the external magnetic field H parallel with the direction D1. Therefore, the magnetic field sensing apparatus 10 can realize measurement of magnetic field in three directions on the plane through the magnetic field sensing devices 100a and 100b.

Additionally, since the magnetic flux concentrator 110 having the capability of bending the external magnetic field H is formed on the surface S1 of the substrate S, the electrical signal related to the magnetic field in the direction D3 can be transferred such that the magneto-resistive sensor 120 disposed on the plane S1 can be used for sensing. The electrical signal related to the magnetic fields in the directions D1 and D2 may be sensed by the magneto-resistive sensor 120 disposed on the plane S1. Accordingly, the configuration of the magnetic field sensing apparatus 10 in the embodiment not only can realize measurement of the magnetic field in three directions on the plane, but also can be applied to wafer level packaging technique.

In other examples, persons having ordinary skill in the art can make modification to the circuit configuration as appropriate depending on actual need and design. For example, the magneto-resistive sensors 120 may be formed as Wheatstone half bridge, Wheatstone full bridge, single-ended sensing resistors, a pair of compensated single-ended sensing resistors or a combination thereof, the invention provides no limitation to the circuit configuration.

It is to be explained that, the following embodiment has adopted component notations and part of the contents from the previous embodiment, wherein the same notations are used for representing the same or similar components, and descriptions of the same technical contents are omitted. The descriptions regarding the omitted part may be referred to the previous embodiments, and thus are not repeated herein.

Referring to FIG. 1B, in a magnetic field sensing apparatus 10', the magnetic flux concentrator 110 in a magnetic field sensing device 100a' includes four magnetic flux concentrators 112a, 114a, 116a and 118a. The first orthogonal projection region P1 of each of the magnetic flux concentrators 110 on the substrate S only overlaps the third orthogonal projection region P3 of one magnetic setting structure 130 on the substrate S. For example, the first orthogonal projection region P1 of the magnetic flux concentrator 112a only overlaps the third orthogonal projection region P3 of the magnetic setting structure 132a, and the rest may be deduced from the above. The magnetic setting structures 132a and 134a may set the magnetized direction of the magnetic flux concentrator 112a and magnetic flux concentrator 116a as anti-parallel with each other, and the rest may be deduced from the above. Descriptions regarding the magnetic field sensing device 100b' is similar to the descriptions regarding magnetic field sensing device 100a', and thus related descriptions are omitted hereinafter. Moreover, the magnetic field sensing apparatus 10' has the effect similar to the effect of the magnetic field sensing apparatus 10 and capable of achieving the effect of sensing magnetic field in three directions through similar circuit configuration, and thus related descriptions are omitted hereinafter.

FIG. 8A to FIG. 10A are schematic top views of a magnetic field sensing apparatus according to different embodiments of the invention. FIG. 8B to FIG. 10B are schematic top views of modified embodiment of the magnetic field sensing apparatus in FIG. 8A to FIG. 10A.

Figure 8A:
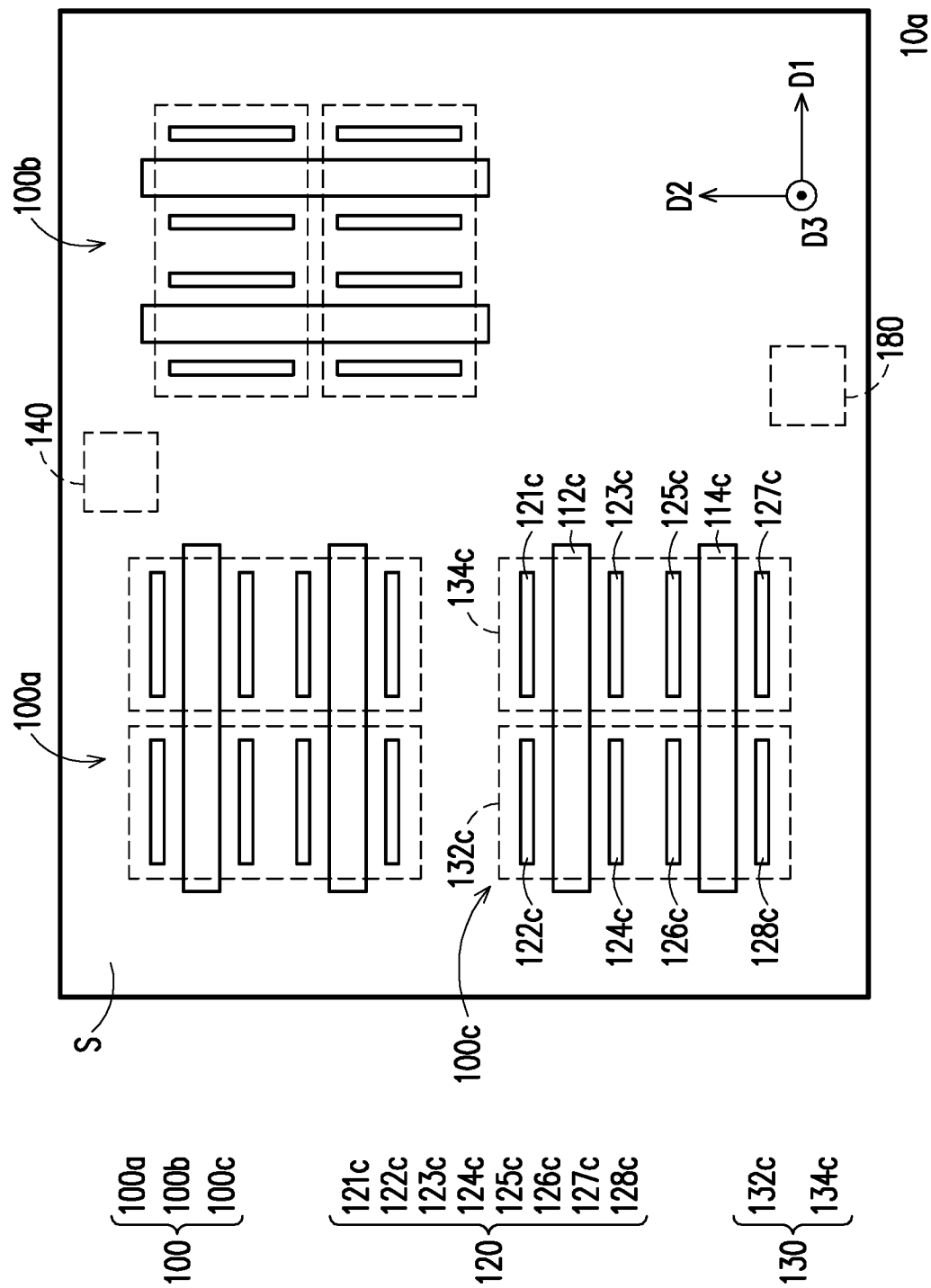

Referring to FIG. 8A, a magnetic field sensing apparatus 10a is substantially similar to the magnetic field sensing apparatus 10, and the main difference is that the magnetic field sensing apparatus 10a further includes a magnetic field sensing device 100c. The construction and actuation of the magnetic field sensing device 100c are similar to that of the magnetic field sensing device 100a, and related descriptions can be derived from the foregoing paragraphs and thus omitted hereinafter. In the embodiment, the magneto-resistive sensors 121a-128a, the magneto-resistive sensors 121b-128b and the magneto-resistive sensors 121c-128c may respectively form three Wheatstone full bridges, wherein the Wheatstone full bridge of the magnetic field sensing device 100a is configured to sense the magnetic field in the direction D2, the Wheatstone full bridge of the magnetic field sensing device 100b is configured to sense the magnetic field in the direction D1, and the Wheatstone full bridge of the magnetic field sensing device 100c is configured to sense the magnetic field in the direction D3, thereby realizing the effect of sensing the magnetic field in three directions. In other words, each of the magnetic field sensing devices is a single-direction magnetic sensor.

Figure 8B:
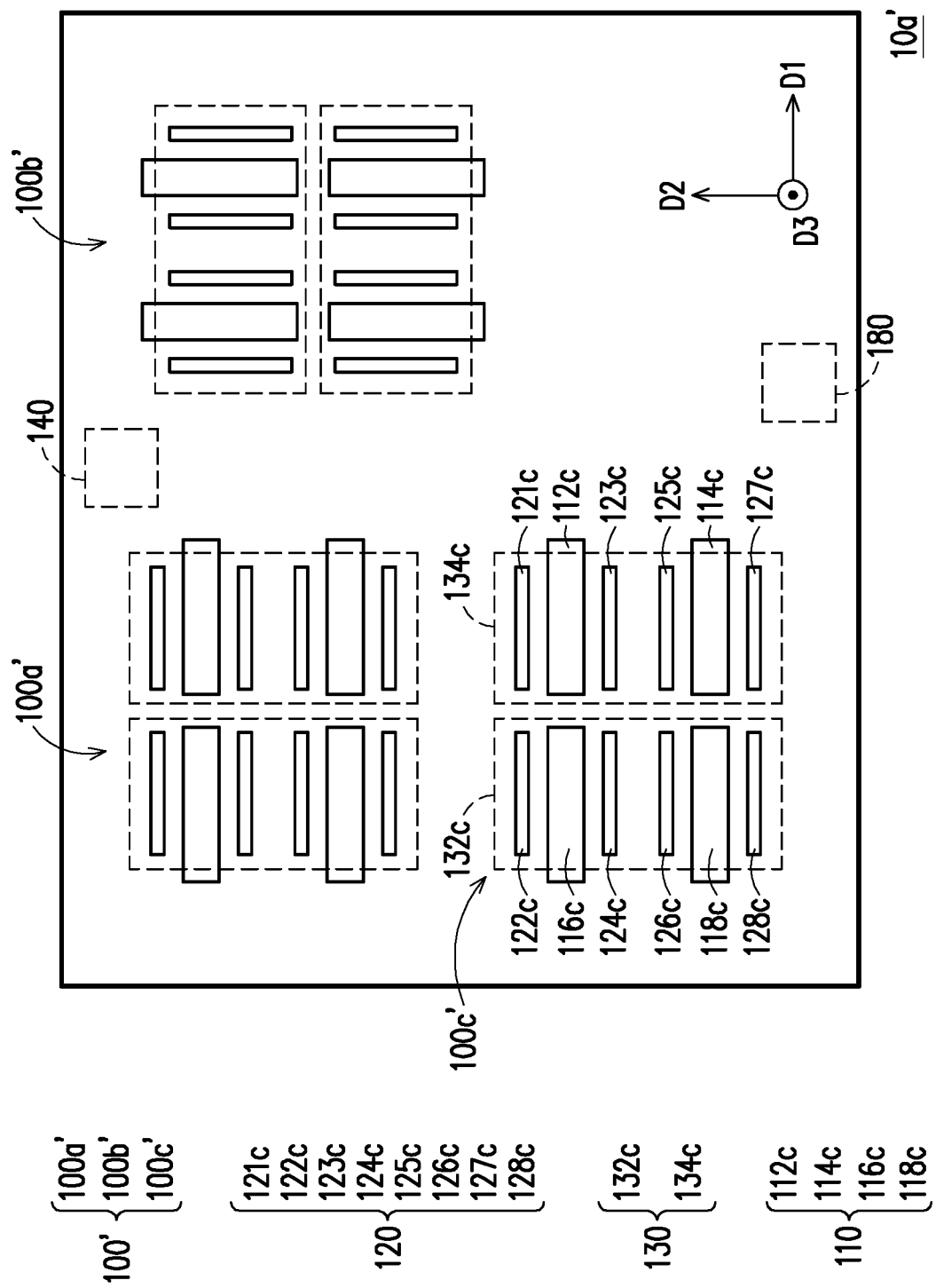

Referring to FIG. 8B, a magnetic field sensing apparatus 10a' is substantially similar to the magnetic field sensing apparatus 10a, and related descriptions regarding the modification thereof may be derived from the exemplary embodiment in FIG. 1B and thus omitted hereinafter.

Figure 9A:
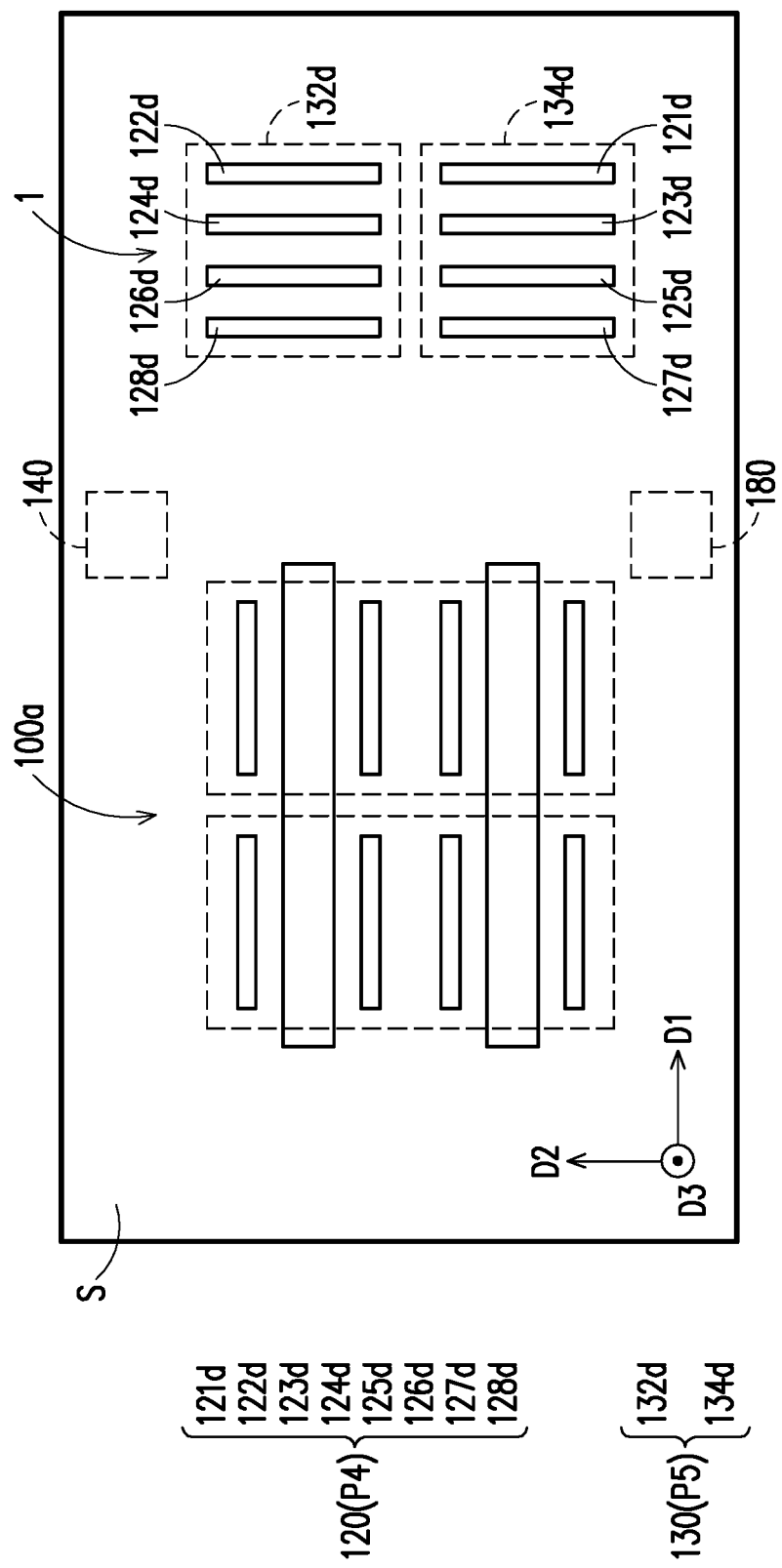

Referring to FIG. 9A, a magnetic field sensing apparatus 10b is substantially similar to the magnetic field sensing apparatus 10, and the main difference is that the magnetic field sensing apparatus 10b is not provided with the magnetic field sensing device 100b but provided with a magnetic sensor 1. The magnetic sensor 1 includes a plurality of magneto-resistive sensors 120 (121d-128d) disposed on the substrate S and a plurality of magnetic setting structures 130 (132d, 134d) disposed on the substrate S. In the magnetic sensor 1, an orthogonal projection region of at least a portion of the magneto-resistive sensors 120 on the substrate S is a fourth orthogonal projection region P4. An orthogonal projection region of each of the magnetic setting structures 130 on the substrate S is a fifth orthogonal projection region P5. The fifth orthogonal projection region P5 overlaps at least a portion of the fourth orthogonal projection region P4. Specifically, the orthogonal projection region P4 of at least a portion (121d, 123d, 125d, 127d) of the magneto-resistive sensors 120 on the substrate S overlaps the orthogonal projection region P5 of the magnetic setting structure 134d, and the orthogonal projection region P4 of at least a portion (122d, 124d, 126d and 128d) of the magneto-resistive sensors 120 on the substrate S overlaps the orthogonal projection region P5 of the magnetic setting structure 132d. The current generator 140 is also coupled to the magnetic setting structures 132d and 134d, and capable of setting the magnetized direction of the magneto-resistive sensors 121*d*-128*d* through the magnetic field setting method shown in FIG. 5B. In the embodiment, the magneto-resistive sensors 120 in the magnetic field sensing device 100*a* may form two different Wheatstone full bridges during different time intervals through the circuit connecting method of the Wheatstone half bridge shown in FIG. 6A to FIG. 6D, thereby respectively sensing the magnetic fields in the direction D2 and the direction D3. The magneto-resistive sensors 121*d*-128*d* in the magnetic sensor 1 may be electrically connected to form a Wheatstone full bridge, thereby sensing the magnetic field in the direction D1.

Figure 9B:
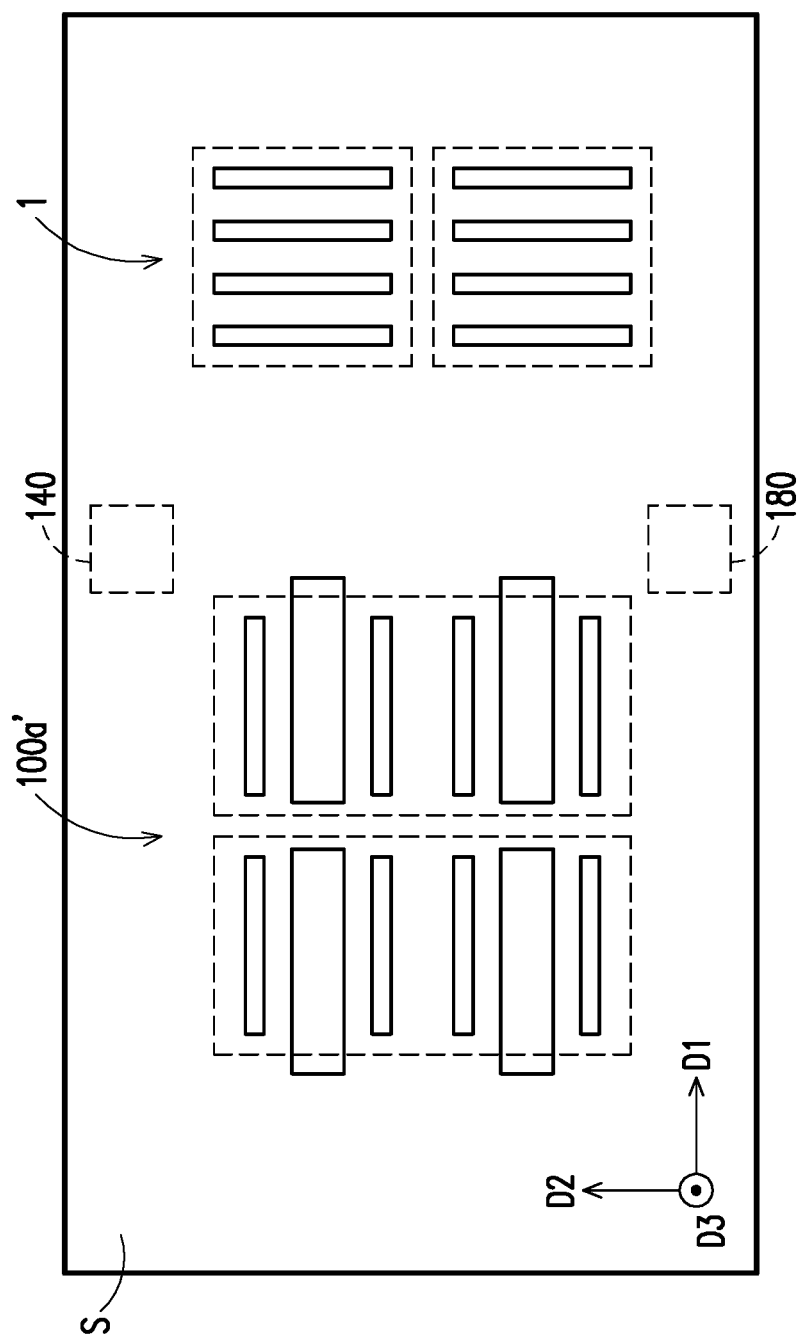

Referring to FIG. 9B, a magnetic field sensing apparatus 10*b'* is substantially similar to the magnetic field sensing apparatus 10*b*; the related descriptions regarding the modification thereof may be derived from the exemplary embodiment shown in FIG. 1B and thus omitted hereinafter.

Figure 10A:
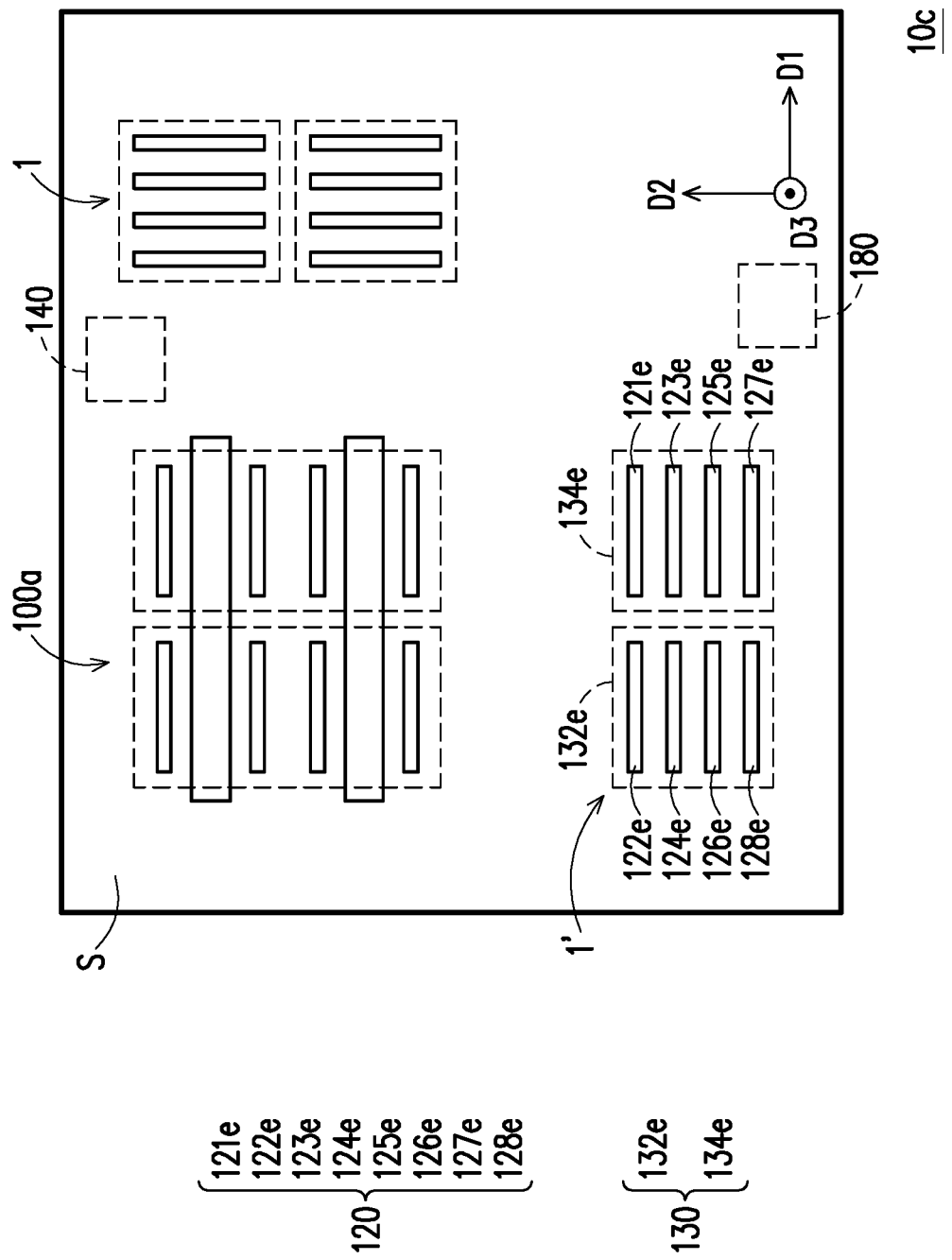

Referring to FIG. 10A, a magnetic field sensing apparatus 10*c* is substantially similar to the magnetic field sensing apparatus 10*b*, and the main difference is that the magnetic field sensing apparatus 10*c* further includes a magnetic sensor 1'. The construction of the magnetic sensor 1' is similar to the construction of the magnetic sensor 1, and the main difference lies in configuration. The magnetic sensor 1' is equivalent to the magnetic sensor 1 rotated by 90 degrees in counter-clock direction; other related descriptions are similar to the descriptions of the magnetic sensor 1 and thus omitted hereinafter. In the embodiment, the magneto-resistive sensors 121*a*-128*a*, the magneto-resistive sensors 121*d*-128*d* and the magneto-resistive sensors 121*e*-128*e* may respectively form three Wheatstone full bridges, wherein the Wheatstone full bridge of the magnetic field sensing device 100*a* is configured to sense the magnetic field in the direction D3, the Wheatstone full bridge of the magnetic sensor 1 is configured to sense the magnetic field in the direction D1, and the Wheatstone full bridge of the magnetic sensor 1' is configured to sense the magnetic field in the direction D2.

Figure 10B:
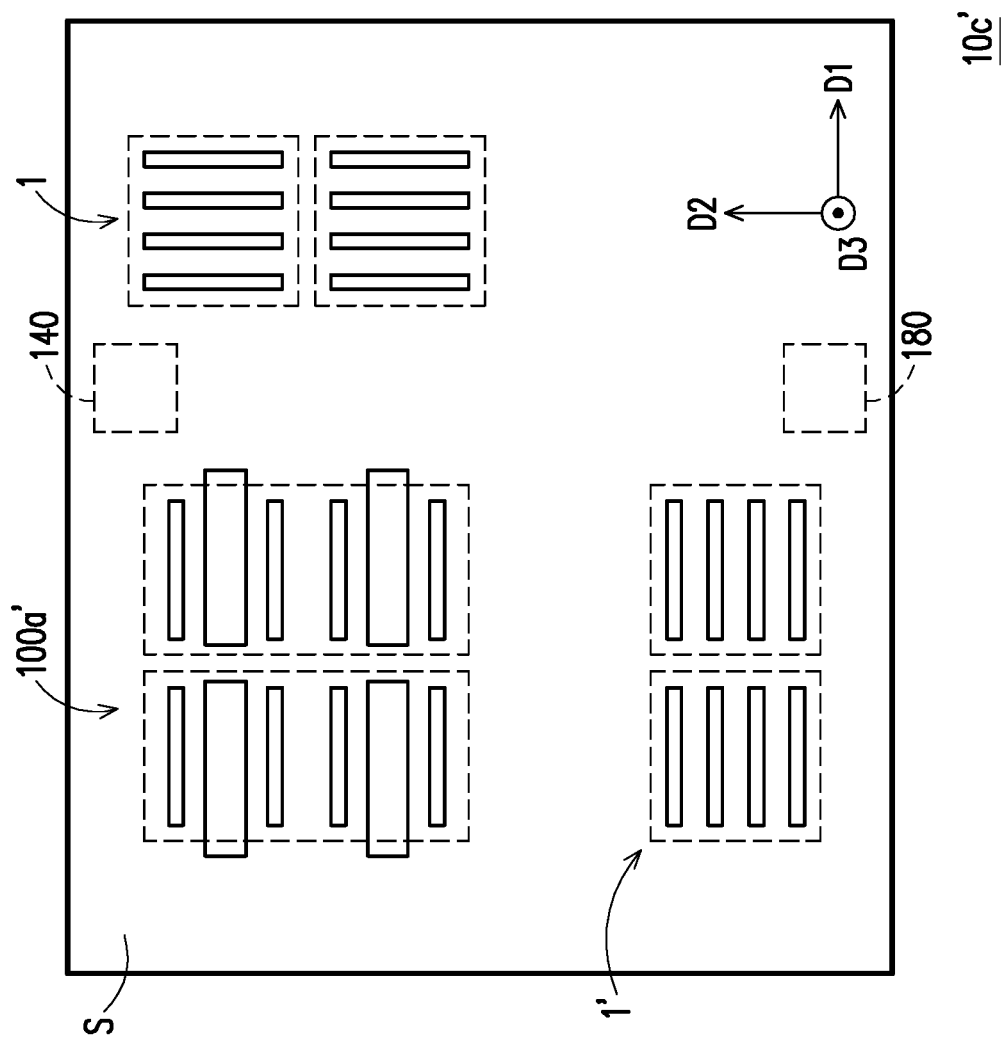

Referring to FIG. 10B, a magnetic field sensing apparatus 10*c'* is substantially similar to the magnetic field sensing apparatus 10*c*, and the related descriptions regarding the modification thereof may be derived from the exemplary embodiment shown in FIG. 1B and thus omitted hereinafter.

In summary, in the magnetic field sensing device and the magnetic field sensing apparatus in the embodiment of the invention, by arranging the magnetic setting structures to spatially overlap the magneto-resistive sensors and the magnetic flux concentrators respectively, it is possible for the magnetic setting structures to simultaneously reset the magnetized directions of the magneto-resistive sensors and the magnetic flux concentrators and thus having a smaller size, and it is possible to further eliminate the residual magnetism therein, thus obtaining an accurate sensing result.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A magnetic field sensing device, comprising:
    a substrate;
    a plurality of magnetic flux concentrators, disposed on the substrate, wherein each of the magnetic flux concentrators is extended in a first direction or a second direction, and the magnetic flux concentrators are arranged along the second direction or the first direction;
    a plurality of magneto-resistive sensors, disposed on the substrate, wherein at least a portion of the magneto-resistive sensors is disposed on two opposite sides of each of the magnetic flux concentrators, each of the magneto-resistive sensors is extended in the first direction or the second direction, the magneto-resistive sensors are arranged along the second direction or the first direction, and a magnetic field sensing axis of the magneto-resistive sensors is parallel with the second direction or the first direction; and
    a plurality of magnetic setting structures, disposed on the substrate, wherein each of the magnetic setting structures is extended in the second direction or the first direction, and the magnetic setting structures are arranged along the first direction or the second direction,
    wherein,
    an orthogonal projection region of each of the magnetic flux concentrators on the substrate is a first orthogonal projection region,
    an orthogonal projection region of at least a portion of the magneto-resistive sensors on the substrate is a second orthogonal projection region,
    an orthogonal projection region of each of the magnetic setting structures on the substrate is a third orthogonal projection region,
    the third orthogonal projection region at least overlaps a portion of the first orthogonal projection region and a portion of the second orthogonal projection region respectively,
    wherein the first direction is different from the second direction.

2. The magnetic field sensing device according to claim 1, further comprising:
    a current generator, coupled to the magnetic setting structures, the magnetic setting structures further comprising two magnetic setting structures, and the current generator adapted to supply two currents having opposite current directions to the two magnetic setting structures respectively.

3. The magnetic field sensing device according to claim 1, further comprising a switching circuit, each of the magnetic flux concentrators having a first side and a second side opposite to each other, wherein,
    a portion of the magneto-resistive sensors located at the first side of each of the magnetic flux concentrators forms a first Wheatstone half bridge,
    a portion of the magneto-resistive sensors located at the second side of each of the magnetic flux concentrators forms a second Wheatstone half bridge,
    the switching circuit electrically connects the first Wheatstone half bridge and the second Wheatstone half bridge as at least two Wheatstone full bridges during different time intervals, thereby respectively measuring magnetic field components in two different directions, such that the at least two Wheatstone full bridges output two signals respectively corresponding to the magnetic field components in the two different directions.

4. The magnetic field sensing device according to claim 1, wherein each of the magnetic flux concentrators has a first side and a second side opposite to each other, wherein,
    a portion of the magneto-resistive sensors located at the first side of each of the magnetic flux concentrators forms a first Wheatstone full bridge, a portion of the magneto-resistive sensors located at the second side of each of the magnetic flux concentrators forms a second Wheatstone frill bridge, wherein the magnetic field sensing device obtain magnetic field components in two different directions according to a first output signal of the first Wheatstone full bridge and a second output signal of the second Wheatstone full bridge.

5. The magnetic field sensing device according to claim 1, wherein each of the first orthogonal projection regions simultaneously overlaps the third orthogonal projection regions.

6. The magnetic field sensing device according to claim 1, wherein each of the first orthogonal projection regions only overlaps one of the third orthogonal projection regions.

7. The magnetic field sensing device according to claim 1, wherein the first orthogonal projection regions and the second orthogonal projection regions are staggered.

8. The magnetic field sensing device according to claim 1, wherein the magnetic flux concentrators and the magnetic setting structures are disposed at the same side of the magneto-resistive sensors.

9. The magnetic field sensing device according to claim 1, wherein the magnetic flux concentrators and the magnetic setting structures are respectively disposed at two opposite sides of the magneto-resistive sensors.

10. A magnetic field sensing apparatus, comprising:
a substrate;
at least one magnetic field sensing device, comprising:
a plurality of first magnetic flux concentrators, disposed on the substrate, wherein each of the first magnetic flux concentrators is extended in a first direction or a second direction, and the first magnetic flux concentrators are arranged along the second direction or the first direction;
a plurality of first magneto-resistive sensors, disposed on the substrate, wherein at least a portion of the first magneto-resistive sensors is disposed at two opposite sides of each of the first magnetic flux concentrators, each of the first magneto-resistive sensors is extended in the first direction or the second direction, the first magneto-resistive sensors are arranged along the second direction or the first direction, and a first magnetic field sensing axis of the first magneto-resistive sensors is parallel with the second direction or the first direction; and
a plurality of first magnetic setting structures, disposed on the substrate, wherein each of the first magnetic setting structures is extended in the second direction or the first direction, and the first magnetic setting structures are arranged along the first direction or the second direction,
wherein,
an orthogonal projection region of each of the first magnetic flux concentrators on the substrate is a first orthogonal projection region,
an orthogonal projection region of at least a portion of the first magneto-resistive sensors on the substrate is a second orthogonal projection region,
an orthogonal projection region of each of the first magnetic setting structures on the substrate is a third orthogonal projection region,
the third orthogonal projection region at least overlaps a portion of the first orthogonal projection region and a portion of the second orthogonal projection region respectively,
wherein the first direction is different from the second direction.

11. The magnetic field sensing apparatus according to claim 10, further comprising at least one magnetic sensor, the magnetic sensor comprising a plurality of second magneto-resistive sensors and a plurality of second magnetic setting structures, the second magneto-resistive sensors and the second magnetic setting structures disposed on the substrate, wherein,
an orthogonal projection region of at least a portion of the second magneto-resistive sensors on the substrate is a fourth orthogonal projection region;
an orthogonal projection region of each of the second magnetic setting structures on the substrate is a fifth orthogonal projection region,
the fifth orthogonal projection region at least overlaps a portion of the fourth orthogonal projection region.

12. The magnetic field sensing apparatus according to claim 11, wherein, in one of the magnetic sensors,
each of the second magnetic setting structures is extended in the first direction or the second direction, and the second magnetic setting structures are arranged along the second direction or the first direction; and
each of the second magneto-resistive sensors is extended in the second direction or the first direction, and the second magneto-resistive sensors are arranged along the first direction or the second direction, a second magnetic field sensing axis of the second magneto-resistive sensors are parallel with the first direction or the second direction.

13. The magnetic field sensing apparatus according to claim 10, wherein each of the first orthogonal projection regions simultaneously overlaps the third orthogonal projection regions.

14. The magnetic field sensing apparatus according to claim 10, wherein each of the first orthogonal projection regions only overlaps one of the third orthogonal projection regions.

15. The magnetic field sensing apparatus according to claim 10, wherein the first orthogonal projection regions and the second orthogonal projection regions are staggered.

* * * * *